United States Patent
Choi et al.

(10) Patent No.: US 12,217,984 B2
(45) Date of Patent: Feb. 4, 2025

(54) WAFER PROCESSING APPARATUS INCLUDING EFEM AND METHOD OF PROCESSING WAFER

(71) Applicant: SAMSUNG ELECTRONICS CO., LTD., Suwon-si (KR)

(72) Inventors: Jinhyuk Choi, Suwon-si (KR); Myungki Song, Hwaseong-si (KR); Kongwoo Lee, Seoul (KR); Kyusang Lee, Suwon-si (KR); Beomsoo Hwang, Seoul (KR); Keonwoo Kim, Yongin-si (KR); Jonghwi Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 17/722,838

(22) Filed: Apr. 18, 2022

(65) Prior Publication Data

US 2023/0080991 A1 Mar. 16, 2023

(30) Foreign Application Priority Data

Sep. 10, 2021 (KR) .................. 10-2021-0121178

(51) Int. Cl.
*H01L 21/67* (2006.01)
*H01L 21/677* (2006.01)
*H01L 21/687* (2006.01)

(52) U.S. Cl.
CPC .. *H01L 21/67184* (2013.01); *H01L 21/67201* (2013.01); *H01L 21/67778* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 6,486,444 B1* | 11/2002 | Fairbairn | H01L 21/67196 118/724 |
| 8,944,739 B2* | 2/2015 | Chen | H01L 21/67733 414/217 |
| 9,698,036 B2* | 7/2017 | Aguilar | H01L 21/67736 |
| 9,818,633 B2 | 11/2017 | Lill et al. | |
| 10,679,878 B2 | 6/2020 | Sakata | |
| 10,811,289 B2 | 10/2020 | Tsuji | |
| 10,822,698 B2 | 11/2020 | Nishino | |
| 11,069,550 B2* | 7/2021 | Fujiwara | H01L 21/67745 |
| 11,127,613 B2* | 9/2021 | Kuwahara | H01L 21/67733 |
| 11,688,619 B2* | 6/2023 | Wakabayashi | H01L 21/67196 414/805 |
| 2020/0075377 A1 | 3/2020 | Wakabayashi | |
| 2022/0044952 A1 | 2/2022 | Wakabayashi | |

FOREIGN PATENT DOCUMENTS

| | | |
|---|---|---|
| KR | 10-2021-0055082 A | 5/2021 |
| KR | 10-2247183 B1 | 5/2021 |

* cited by examiner

*Primary Examiner* — Michael S Lowe
(74) *Attorney, Agent, or Firm* — Sughrue Mion, PLLC

(57) ABSTRACT

A wafer processing apparatus may include a plurality of equipment front end modules (EFEMs), a wafer transfer chamber, a wafer processing chamber, and a wafer transfer arm. Each of the plurality of EFEMs may include an EFEM chamber, a plurality of load ports provided at a side of the EFEM chamber, and a load lock provided at a side of the EFEM chamber to overlap with at least one of the plurality of load ports in a vertical direction.

20 Claims, 25 Drawing Sheets

Embodiments of the present disclosure relate to a wafer processing apparatus and method, and more particularly, to a wafer processing apparatus including an equipment front end module (EFEM) and a wafer processing method using the wafer processing apparatus.

WAFER PROCESSING APPARATUS INCLUDING EFEM AND METHOD OF PROCESSING WAFER

CROSS-REFERENCE TO THE RELATED APPLICATION

This application is based on and claims priority under 35 U.S.C. § 119 to Korean Patent Application No. 10-2021-0121178, filed on Sep. 10, 2021, in the Korean Intellectual Property Office, the disclosure of which is incorporated by reference herein in its entirety.

BACKGROUND

Embodiments of the present disclosure relate to a wafer processing apparatus and method, and more particularly, to a wafer processing apparatus including an equipment front end module (EFEM) and a wafer processing method using the wafer processing apparatus.

The wafer processing apparatus may include: an EFEM including a load port on which a wafer carrier is seated, a load lock, which is configured to accommodate a wafer temporarily and an internal pressure which is controllable, and an arm configured to unload a wafer from the wafer carrier and load the wafer into the load lock; a wafer processing chamber for processing a wafer; and a wafer transfer arm for transferring a wafer from the EFEM to the wafer processing chamber. In recent years, research is being actively conducted to reduce the size of the wafer processing apparatus so as to improve wafer processing efficiency in a process chamber in which the wafer processing apparatus is installed.

SUMMARY

One aspect of embodiments of the present disclosure is directed to reducing the size of a wafer processing apparatus so as to improve wafer processing efficiency per unit area.

One aspect of embodiments of the present disclosure is directed to providing a wafer processing apparatus capable of improving wafer processing efficiency regardless of defects of some components of an equipment front end module (EFEM).

According to one or more embodiments, a wafer processing apparatus is provided. The wafer processing apparatus includes a first EFEM including: a first EFEM chamber; a plurality of first load ports provided at at least one from among a first side and a second side of the first EFEM chamber, and configured to support a first wafer carrier accommodating a first wafer; a first load lock provided at the first side or the second side of the first EFEM chamber and vertically overlapping with at least one from among the plurality of first load ports; and a first EFEM arm configured to be moved within the first EFEM chamber to unload the first wafer from the first wafer carrier and load the first wafer into the first load lock, or to unload the first wafer from the first load lock and load the first wafer into the first wafer carrier. The wafer processing apparatus further includes a second EFEM provided at the first side of the first EFEM and including: a second EFEM chamber spaced apart from the first EFEM chamber; a plurality of second load ports provided at at least one from among a first side and a second side of the second EFEM chamber and configured to support a second wafer carrier accommodating a second wafer; a second load lock provided at the first side or the second side of the second EFEM chamber and vertically overlapping with at least one from among the plurality of second load ports; and a second EFEM arm configured to be moved within the second EFEM chamber to unload the second wafer from the second wafer carrier and load the second wafer into the second load lock, or to unload the second wafer from the second load lock and load the second wafer into the second wafer carrier. The wafer processing apparatus further includes: a wafer transfer chamber connected to the first load lock of the first EFEM and the second load lock of the second EFEM; a plurality of wafer processing chambers connected to the wafer transfer chamber; and a wafer transfer arm provided in the wafer transfer chamber and configured to supply at least one of the first wafer and the second wafer to at least one from among the plurality of wafer processing chambers.

According to one or more embodiments, a wafer processing apparatus is provided. The wafer processing apparatus includes a first EFEM that includes: a first EFEM chamber; a first upper load port provided at a first side or a second side of the first EFEM chamber; a first lower load port provided at a first side or a second side of the first EFEM chamber and vertically overlapping with the first upper load port; a first load lock provided at the first side or the second side of the first EFEM chamber and vertically overlapping with the first upper load port and the first lower load port; and a first EFEM arm configured to transfer a first wafer between a first wafer carrier, while the first wafer carrier is seated on at least one from among the first upper load port and the first lower load port, and the first load lock. The wafer processing apparatus further includes a second EFEM provided at the first side of the first EFEM, and including: a second EFEM chamber spaced apart from the first EFEM chamber; a second upper load port provided at a first side or a second side of the second EFEM chamber; a second lower load port provided at the first side or the second side of the second EFEM chamber and vertically overlapping with the second upper load port; a second load lock provided at the first side or the second side of the second EFEM chamber and vertically overlapping with the second upper load port and the second lower load port; and a second EFEM arm configured to transfer a second wafer between a second wafer carrier, while the second wafer carrier is seated on at least one from among the second upper load port and the second lower load port, and the second load lock. The wafer processing apparatus further includes: a wafer transfer chamber connected to the first load lock of the first EFEM and the second load lock of the second EFEM; a plurality of wafer processing chambers connected to the wafer transfer chamber; and a wafer transfer arm provided in the wafer transfer chamber and configured to supply at least one from among the first wafer and the second wafer to at least one of the plurality of wafer processing chambers.

According to one or more embodiments, a wafer processing method is provided. The wafer processing method includes: mounting a wafer carrier accommodating a wafer on a load port, the load port provided at a first side or a second side of an equipment front end module (EFEM) chamber; connecting the wafer carrier to the EFEM chamber by operating the load port; unloading, by an EFEM arm configured to be moved within the EFEM chamber in a vertical direction, the wafer from the wafer carrier; loading, by the EFEM arm, the wafer into a wafer aligner to align the wafer; and unloading, by the EFEM arm, the wafer from the wafer aligner and loading, by the EFEM arm, the wafer into a load lock, the load lock provided at the first side of the EFEM chamber and overlapped with the load port in the vertical direction.

In an embodiment of the present disclosure, an EFEM of a wafer processing apparatus may include a load lock overlapping at least one of a plurality of load ports in a vertical direction. In addition, a wafer aligner and a wafer buffer device of the EFEM may also overlap at least one of the plurality of load ports in the vertical direction. Accordingly, the size of the EFEM may decrease and wafer processing efficiency per unit area of a wafer processing apparatus including the EFEM can be improved.

A wafer processing apparatus according to an embodiment of the present disclosure may include an EFEM connection device for connecting a plurality of EFEMs and thus is capable of continuously performing a wafer processing process even when a defect occurs in at least one of components of the plurality of EFEMs. Accordingly, the wafer processing efficiency of the wafer processing apparatus can be improved.

BRIEF DESCRIPTION OF THE DRAWINGS

Embodiments of the present disclosure will be more clearly understood from the following detailed description taken in conjunction with the accompanying drawings in which.

DETAILED DESCRIPTION

Hereinafter, non-limiting example embodiments of the present disclosure will be described in detail with reference to the accompanying drawings.

Figure 1:
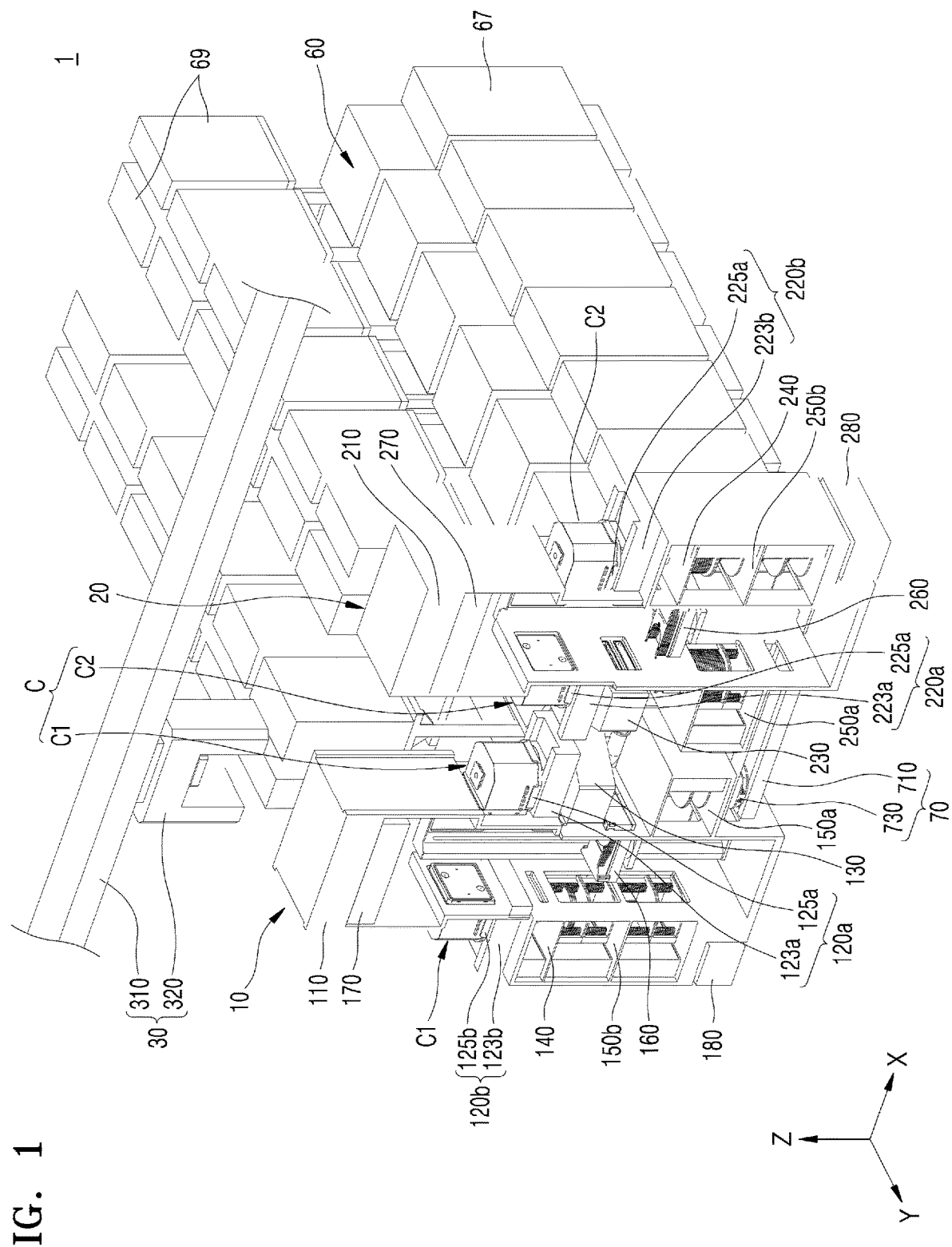
FIG. 1 is a perspective view of a wafer processing apparatus according to an embodiment of the present disclosure.
Figure 2:
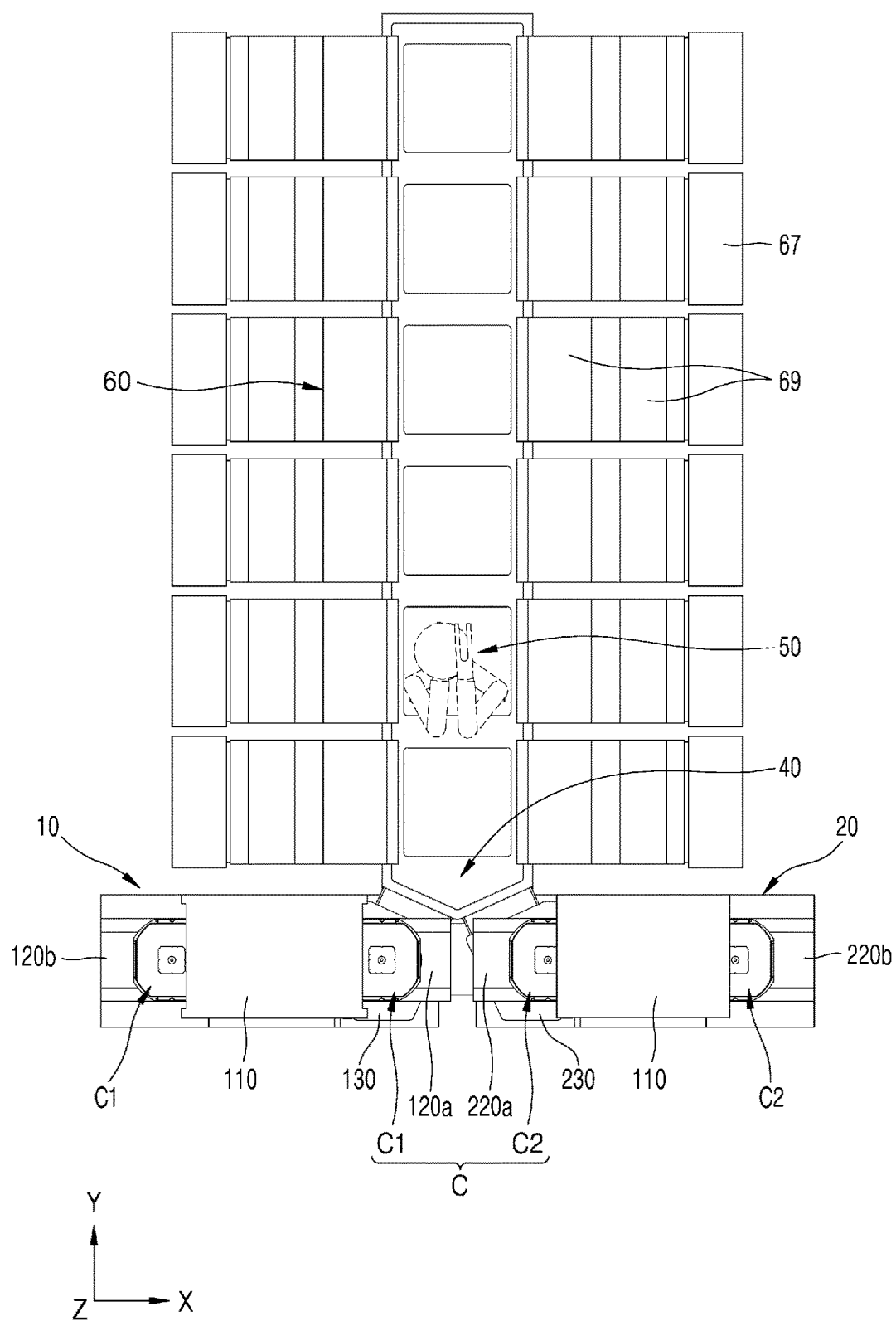
FIG. 2 is a plan view of a wafer processing apparatus according to an embodiment of the present disclosure.
Figure 3:
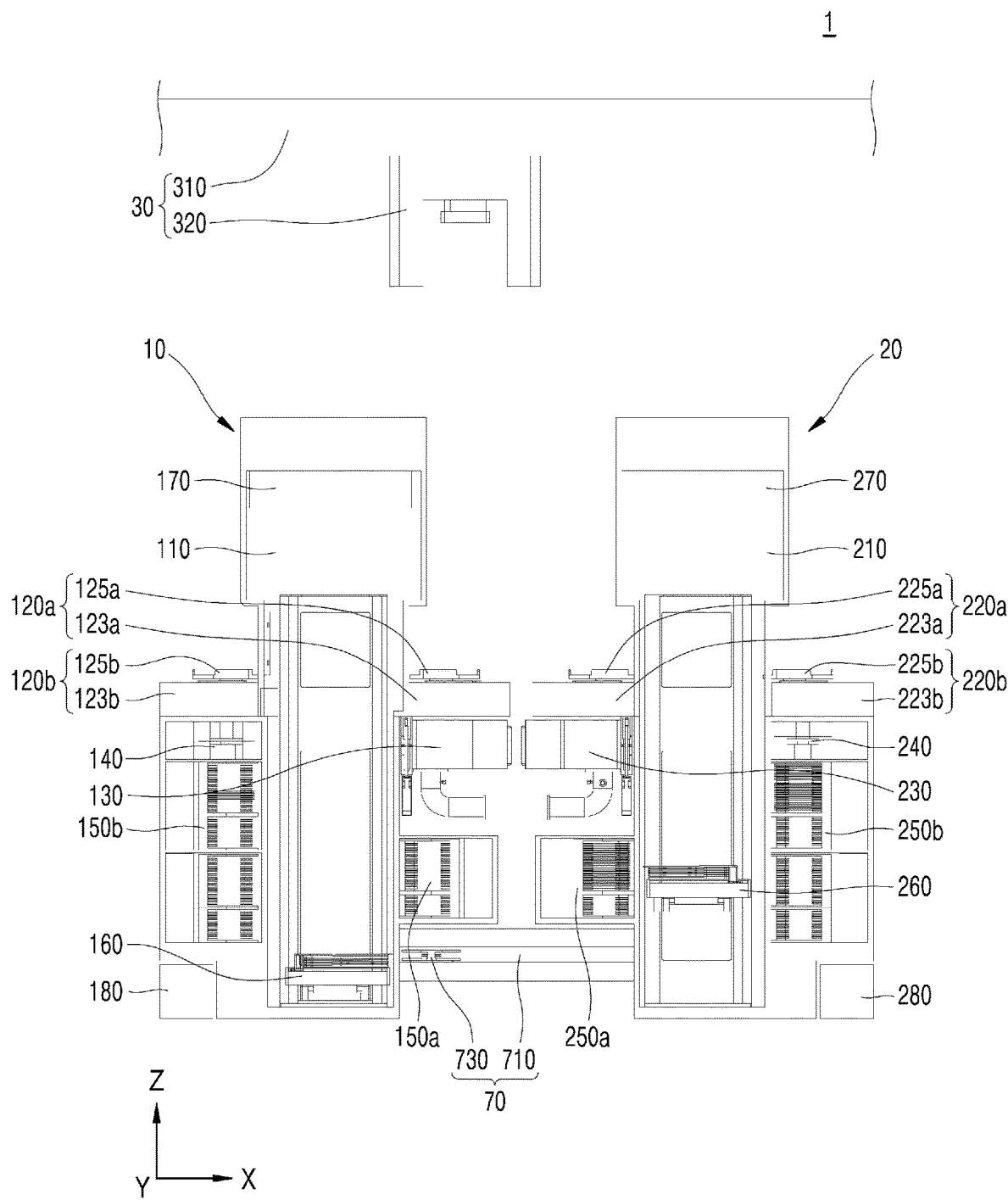
FIG. 3 is a front view of a wafer processing apparatus according to an embodiment of the present disclosure.

FIG. 1 is a perspective view of a wafer processing apparatus 1 according to an embodiment of the present disclosure. FIG. 2 is a plan view of the wafer processing apparatus 1 according to an embodiment of the present disclosure. FIG. 3 is a front view of the wafer processing apparatus 1 according to an embodiment of the present disclosure.

Referring to FIGS. 1 to 3, the wafer processing apparatus 1 of an embodiment of the present disclosure may include a wafer carrier transfer device 30, a first equipment front end module (EFEM) 10, a second EFEM 20, a wafer transfer chamber 40, a wafer transfer arm 50, a wafer processing chamber 60, and an EFEM connection device 70.

Hereinafter, a horizontal direction may be defined as a direction parallel to a direction in which a bottom surface of the first EFEM 10 and a bottom surface of the second EFEM 20 extend (e.g., a direction in which an X-Y plane extend). A vertical direction may be defined as a direction perpendicular to the direction in which the bottom surface of the first EFEM 10 and/or the bottom surface of the second EFEM 20 extend (e.g., a Z-axis direction).

The wafer carrier transfer device 30 may be provided above the first EFEM 10 and the second EFEM 20 and configured to transfer a wafer carrier C. In an embodiment, the wafer carrier transfer device 30 may include an overhead hoist transport device. In an embodiment, the wafer carrier C transferred by the wafer carrier transfer device 30 may include a front opening unified pod (FOUP) configured to accommodate a plurality of wafers.

Specifically, the wafer carrier transfer device 30 may transfer the wafer carrier C to the first EFEM 10 and the second EFEM 20 to perform a wafer processing process. In addition, the wafer carrier transfer device 30 may receive the wafer carrier C accommodating a wafer on which the wafer carrier transfer device is performed from the first EFEM 10 and the second EFEM 20, and transfer the wafer carrier C to a chamber for a subsequent process.

The wafer carrier transfer device 30 may include a wafer carrier transfer line 310 and a wafer carrier transfer robot 320. The wafer carrier transfer line 310 may be provided above the first EFEM 10 and the second EFEM 20 and provide a horizontal-direction moving path of the wafer carrier transfer robot 320. For example, the wafer carrier transfer line 310 may extend above the first EFEM 10 and the second EFEM 20 in the horizontal direction (e.g., the direction in which the X-Y plane extends).

The wafer carrier transfer robot 320 may move the wafer carrier C in the horizontal direction along a transfer path provided by the wafer carrier transfer line 310. The wafer carrier transfer robot 320 may be configured to be moved in the vertical direction to pick up the wafer carrier C from first load ports (e.g., a first inner load port 120a and a first outer load port 120b) of the first EFEM 10 and second load ports (e.g., a second inner load port 220a and a second outer load port 220b) of the second EFEM 20 or to provide the wafer carrier C to the first inner load port 120a and the first outer load port 120b of the first EFEM 10 and the second inner load port 220a and the second outer load port 220b of the second EFEM 20. In an embodiment, the wafer carrier transfer robot 320 may include a robot arm configured to grasp or grip the wafer carrier C.

The first EFEM 10 may be configured to unload a first wafer from a first wafer carrier C1 transferred from the wafer carrier transfer device 30, arrange the first wafer, form an ambient atmosphere of the first wafer in a vacuum state, and transfer the first wafer to the wafer transfer chamber 40. The first EFEM 10 may be configured to receive the first wafer on which a wafer processing process is performed from the wafer transfer chamber 40, form an ambient atmosphere of the first wafer in an atmospheric pressure state, temporarily store the first wafer, and load the first wafer into the first wafer carrier C1.

The first EFEM 10 may include a first EFEM chamber 110, a plurality of load ports (e.g., the first inner load port 120a and the first outer load port 120b), a first load lock 130, a first wafer aligner 140, first wafer buffer devices (e.g., a first inner wafer buffer device 150a and a first outer wafer buffer device 150b), a first EFEM arm 160, a first air supply device 170 (e.g., an air supplier), a first vacuum pump 180, and the like.

The first EFEM chamber 110 may be spaced apart from the second EFEM chamber 210 in the horizontal direction, and provide a vertical-direction moving path of the first wafer unloaded from the first wafer carrier C1. In an embodiment, the first EFEM chamber 110 may provide a space in which the first air supply device 170 and the first EFEM arm 160 are provided.

The first inner load port 120a and the first outer load port 120b may be provided at sides of the first EFEM chamber 110 and configured to support the first wafer carrier C1. The first inner load port 120a and the first outer load port 120b may be configured to transfer the first wafer carrier C1 in the horizontal direction (e.g., an X-axis direction) or rotate the first wafer carrier C1 about a rotational axis parallel to the vertical direction (e.g., the Z-axis direction).

The first load ports may include the first inner load port 120a attached to an inner side of the first EFEM chamber 110 and the first outer load port 120b attached to an outer side of the first EFEM chamber 110. The inner side of the first EFEM chamber 110 may be defined as a side of the first EFEM chamber 110 facing the second EFEM 20, and the outer side thereof may be defined as a side of the first EFEM chamber 110 opposite to the inner side of the first EFEM chamber 110.

In an embodiment, the first inner load port 120a may include a first inner transfer rail 123a extending from the inner side of the first EFEM chamber 110 in the horizontal direction, and a first inner transfer tray 125a configured to support the first wafer carrier C1. The first inner transfer tray 125a may be configured to move along the first inner transfer rail 123a in the horizontal direction and rotate about an axis of rotation parallel to the vertical direction.

In an embodiment, the first outer load port 120b may include a first outer transfer rail 123b extending from the outer side of the first EFEM chamber 110 in the horizontal direction, and a first outer transfer tray 125b configured to support the first wafer carrier C1. The first outer transfer tray 125b may be configured to move along the first outer transfer rail 123b in the horizontal direction and rotate about the axis of rotation parallel to the vertical direction.

The first load lock 130 may be provided at a side of the first EFEM chamber 110 to be overlapped by at least one of the first inner load port 120a and the first outer load port 120b in the vertical direction. For example, the first load lock 130 may be provided at a side of the first EFEM chamber 110 to be overlapped by the first inner load port 120a in the vertical direction.

In an embodiment, the first load lock 130 may provide a space in which the first wafer is provided and spatially connect the first EFEM chamber 110 to the wafer transfer chamber 40. A first gate (not shown) may be provided between the first load lock 130 and the first EFEM chamber 110 to permit or block loading or unloading of the first wafer. A second gate (not shown) may be provided between the first load lock 130 and the wafer transfer chamber 40 to permit or block loading or unloading of the first wafer. The first gate and the second gate may include a slit valve.

The first load lock 130 may control pressure of a space accommodating the first wafer. In an embodiment, the first load lock 130 may control the pressure of the space accommodating the first wafer to be substantially the same as or similar to those of the wafer transfer chamber 40 and the wafer processing chamber 60. For example, the first load lock 130 may control the space accommodating the first wafer to have a vacuum pressure. For example, the pressure of the space of the first load lock 130 may be controlled to be 10 Torr or less, $10^{-1}$ Torr or less, or $10^{-3}$ Torr or less.

The first wafer aligner 140 may be provided at a side of the first EFEM chamber 110 to align the first wafer. In an embodiment, the first wafer aligner 140 may include a spinner configured to rotate the first wafer to be oriented in a predetermined direction. For example, the first wafer aligner 140 may be configured to sense a notch on the first wafer and rotates the first wafer, based on a position of the sensed notch. In addition, the first wafer aligner 140 may further include an air supply device configured to supply air in the horizontal direction, thereby reducing particles from being attached to a surface of the first wafer.

In an embodiment, the first wafer aligner 140 may be provided at a side of the first EFEM chamber 110 to be overlapped by at least one of the first inner load port 120a and the first outer load port 120b in the vertical direction. For example, the first wafer aligner 140 may be provided at a side of the first EFEM chamber 110 to be overlapped by the first outer load port 120b in the vertical direction.

The first inner wafer buffer device 150a and the first outer wafer buffer device 150b may be provided at sides of the first EFEM chamber 110 to accommodate the first wafer temporarily. The first inner wafer buffer device 150a and the first outer wafer buffer device 150b may further include an air supply device configured to supply air in the horizontal direction, thereby reducing particles from being attached to surfaces of the first wafer.

FIG. 1 illustrates that the first EFEM 10 includes two first wafer buffer devices (e.g., the first inner wafer buffer device 150a and the first outer wafer buffer device 150b), but the first EFEM 10 may include one wafer buffer device or three or more wafer buffer devices. The first inner wafer buffer device 150a and the first outer wafer buffer device 150b may be provided at sides of the first EFEM chamber 110 to be overlapped by at least one of the first inner load port 120a and the first outer load port 120b in the vertical direction. For example, the first inner wafer buffer device 150a may be provided at a side of the first EFEM chamber 110 to be overlapped by the first inner load port 120a in the vertical direction, and the first outer wafer buffer device 150b may be provided at a side of the first EFEM chamber 110 to be overlapped by the first outer load port 120b in the vertical direction.

The first EFEM arm 160 may be configured to be moved within the first EFEM chamber 110. The first EFEM arm 160 may transfer the first wafer between the first wafer carrier C1 and the first load lock 130. When the first wafer is transferred from the first wafer carrier C1 to the first load lock 130, the first EFEM arm 160 may unload the first wafer from the first wafer carrier C1 and provide the first wafer to the first load lock 130. When the first wafer is transferred from the first load lock 130 to the first wafer carrier C1, the first EFEM arm 160 may unload the first wafer from the first load lock 130 and provide the first wafer to the first wafer carrier C1. In an embodiment, the first EFEM arm 160 may include a robot arm configured to handle a wafer.

The first EFEM arm 160 may transfer the first wafer between the first wafer carrier C1 and the first wafer aligner 140. For example, the first EFEM arm 160 may unload the first wafer from the first wafer carrier C1 and supply the first wafer to the first wafer aligner 140, and unload the first wafer from the first wafer aligner 140 and supply the first wafer to the first load lock 130. The first EFEM arm 160 may transfer the first wafer between the first load lock 130 and the first inner wafer buffer device 150a and the first outer wafer buffer device 150b. The first EFEM arm 160 may unload the first wafer from the first load lock 130 and supply the first wafer to the first inner wafer buffer device 150a and the first outer wafer buffer device 150b, and unload the first wafer from the first inner wafer buffer device 150a and the first outer wafer buffer device 150b and supply the first wafer to the first wafer carrier C1.

The first air supply device 170 may be provided inside the first EFEM chamber 110 and configured to purify an inner space of the first EFEM chamber 110. In an embodiment, the first air supply device 170 may include a fan filter unit (FFU) comprising or consisting of a fan, a suction duct, an exhaust duct, a filter, etc. In addition, the first air supply device 170 may be configured to control internal humidity of the first EFEM chamber 110.

The first vacuum pump 180 may be connected to the first load lock 130 and discharge air from the inside of the first load lock 130 to the outside so as to adjust internal pressure of the first load lock 130 to vacuum pressure.

In an embodiment, the first vacuum pump 180 may be provided to be overlapped by the first outer load port 120b, the first wafer aligner 140, and the first outer wafer buffer device 150b in the vertical direction.

The second EFEM 20 may be spaced apart from the first EFEM 10 in the horizontal direction. The second EFEM 20 may be configured to unload a second wafer from a second wafer carrier C2 transferred from the wafer carrier transfer device 30, align the second wafer, form an ambient atmosphere of the second wafer in a vacuum state, and transfer the second wafer to the wafer transfer chamber 40. The second EFEM 20 may be configured to receive the second wafer on which the wafer processing process is performed from the wafer transfer chamber 40, form an ambient atmosphere of the second wafer in an atmospheric pressure state, temporarily store the second wafer, and load the second wafer into the second wafer carrier C2.

The second EFEM 20 may include a second EFEM chamber 210, a plurality of second load ports (e.g., a second inner load port 220a and a second outer load port 220b), a second load lock 230, a second wafer aligner 240, second wafer buffer devices (e.g., a second inner wafer buffer device 250a and a second outer wafer buffer device 250b), a second EFEM arm 260, a second air supply device 270 (e.g., a second air supplier), a second vacuum pump 280, and the like. Hereinafter, the second EFEM 20 will be described by focusing on differences from the first EFEM 10 while omitting some description of parts of the second EFEM 20 that are same as those of the first EFEM 10.

The second EFEM chamber 210 may be spaced apart from the first EFEM chamber 110 in the horizontal direction and provide a vertical-direction transfer path of the second wafer unloaded from the second wafer carrier C2. In an embodiment, the second EFEM chamber 210 may provide a space in which the second air supply device 270 and the second EFEM arm 260 are provided.

The second inner load port 220a and the second outer load port 220b may be provided at sides of the second EFEM chamber 210 and configured to support the second wafer carrier C2. The second inner load port 220a and the second outer load port 220b may be configured to transfer the second wafer carrier C2 in the horizontal direction (e.g., the X-axis direction) or rotate the second wafer carrier C2 about a rotational axis parallel to the vertical direction (e.g., the Z-axis direction).

The second load ports may include a second inner load port 220a attached to an inner side of the second EFEM chamber 210 and a second outer load port 220b attached to an outer side of the second EFEM chamber 210. The inner side of the second EFEM chamber 210 may be defined as a side of the second EFEM chamber 210 facing the first EFEM 10, and the outer side thereof may be defined as a side of the second EFEM chamber 210 opposite to the inner side of the second EFEM chamber 210.

In an embodiment, the second inner load port 220a may include a second inner transfer rail 223a extending from the inner side of the second EFEM chamber 210 in the horizontal direction, and a second inner transfer tray 225a configured to support the second wafer carrier C2. The second inner transfer tray 225a may be configured to move along the second inner transfer rail 223a in the horizontal direction and rotate about an axis of rotation parallel to the vertical direction.

The second outer load port 220b may include a second outer transfer rail 223b extending from the outer side of the second EFEM chamber 210 in the horizontal direction, and a second outer transfer tray 225b configured to support the second wafer carrier C2. The second outer transfer tray 225b may be configured to move along the second outer transfer rail 223b in the horizontal direction and rotate about the axis of rotation parallel to the vertical direction.

The second load lock 230 may be provided at a side of the second EFEM chamber 210 to be overlapped by at least one of the second inner load port 220a and the second outer load port 220b in the vertical direction. For example, the second load lock 230 may be provided at a side of the second EFEM chamber 210 to be overlapped by the second inner load port 220a in the vertical direction.

In an embodiment, the second load lock 230 may provide a space in which the second wafer is provided and spatially connect the second EFEM chamber 210 to the wafer transfer chamber 40. A gate (not shown) may be provided between the second load lock 230 and the second EFEM chamber 210 to permit or block loading or unloading of the second wafer. A gate (not shown) may be provided between the second load lock 230 and the wafer transfer chamber 40 to permit or block loading or unloading of the second wafer.

The second load lock 230 may control pressure of a space accommodating the second wafer. In an embodiment, the second load lock 230 may control the pressure of the space accommodating the second wafer to be substantially the same as or similar to those of the wafer transfer chamber 40 and the wafer processing chamber 60. For example, the second load lock 230 may control the pressure of the space accommodating the second wafer to be a vacuum pressure. For example, the pressure of the space of the second load lock 230 may be controlled to be 10 Torr or less, $10^{-1}$ Torr or less, or $10^{-3}$ Torr or less.

The second wafer aligner 240 may be provided at a side of the second EFEM chamber 210 to align the second wafer. In an embodiment, the second wafer aligner 120 may include a spinner configured to rotate the second wafer to be oriented in a predetermined direction. In addition, the second wafer aligner 240 may further include an air supply device configured to supply air in the horizontal direction, thereby reducing particles from being attached to a surface of the second wafer.

In an embodiment, the second wafer aligner 240 may be provided at a side of the second EFEM chamber 210 to be overlapped by at least one of the second inner load port 220a and the second outer load port 220b in the vertical direction. For example, the second wafer aligner 240 may be provided at a side of the second EFEM chamber 210 to be overlapped by the second outer load port 220b in the vertical direction.

The second inner wafer buffer device 250a and the second outer wafer buffer device 250b may be provided at sides of the second EFEM chamber 210 to accommodate the second wafer temporarily. The second inner wafer buffer device 250a and the second outer wafer buffer device 250b may further include an air supply device configured to supply air in the horizontal direction, thereby reducing particles from being attached to surfaces of the second wafer.

FIG. 1 illustrates that the second EFEM 20 includes two second wafer buffer devices, but the second EFEM 20 may include one wafer buffer device or three or more wafer buffer devices. The second inner wafer buffer devices may be provided at sides of the second EFEM chamber 210 to be overlapped by at least one of the second inner load port 220a and the second outer load port 220b in the vertical direction. For example, the second inner wafer buffer device 250a may be provided at a side of the second EFEM chamber 210 to be overlapped by the second inner load port 220a in the vertical direction, and the second outer wafer buffer device 250b may be provided at a side of the second EFEM chamber 210 to be overlapped by the second outer load port 220b in the vertical direction.

The second EFEM arm 260 may be configured to be moved within the second EFEM chamber 210. The second EFEM arm 260 may transfer the second wafer between the second wafer carrier C2 and the second load lock 230. The second EFEM arm 260 may unload the second wafer from the second wafer carrier C2 and supply the second wafer to the second load lock 230, and unload the second wafer from the second load lock 230 and supply the second wafer to the second wafer carrier C2. In addition, the second EFEM arm 260 may transfer the second wafer between the second wafer carrier C2 and the second wafer aligner 240 and between the second load lock 230 and the second inner wafer buffer device 250a and the second outer wafer buffer device 250b. In an embodiment, the second EFEM arm 260 may include a robot arm configured to handle a wafer.

The second air supply device 270 may be provided inside the second EFEM chamber 210 and configured to purify an inner space of the second EFEM chamber 210. In an embodiment, the second air supply device 270 may include an FFU comprising or consisting of a fan, a suction duct, an exhaust duct, a filter, etc. In addition, the second air supply device 270 may be configured to control internal humidity of the second EFEM chamber 210.

The second vacuum pump 280 may be connected to the second load lock 230 and discharge air from the inside of the second load lock 230 to the outside so as to adjust internal pressure of the second load lock 230 to vacuum pressure.

In an embodiment, the second vacuum pump 280 may be provided to be overlapped by the second outer load port 220b, the second wafer aligner 240, and the second outer wafer buffer device 250b in the vertical direction.

Because the first EFEM 10 may include the first inner load port 120a and the first outer load port 120b and the second EFEM 20 may include the second inner load port 220a and the second outer load port 220b, the wafer processing efficiency of the wafer processing apparatus 1 including the first EFEM 10 and the second EFEM 20 may be improved.

In addition, the sizes of the first EFEM 10 and the second EFEM 20 may be reduced, because the first load lock 130 of the first EFEM 10 may be provided to be overlapped by at least one of the first inner load port 120a and the first outer load port 120b in the vertical direction and the second load lock 230 of the second EFEM 20 may be provided to be overlapped by at least one of the second inner load port 220a and the second outer load port 220b in the vertical direction.

In addition, the sizes of the first EFEM 10 and the second EFEM 20 may be reduced, because the first wafer aligner 140, the first inner wafer buffer device 150a, and the first outer wafer buffer device 150b of the first EFEM 10 may be provided to be overlapped by at least one of the first inner load port 120a and the first outer load port 120b in the vertical direction, and the second wafer aligner 240, the second inner wafer buffer device 250a, and the second outer wafer buffer device 250b of the second EFEM 20 may be provided to be overlapped by at least one of the second inner load port 220a and the second outer load port 220b in the vertical direction.

Accordingly, the wafer processing efficiency per unit area of the wafer processing apparatus 1 including the first EFEM 10 and the second EFEM 20 may be improved.

The wafer transfer chamber 40 may provide a space of transfer of the first wafer and the second wafer, which are delivered from the first EFEM 10 and the second EFEM 20, to the wafer processing chamber 60. In an embodiment, a part of the wafer transfer chamber 40 may be connected to the first load lock 130 of the first EFEM 10 and the second load lock 230 of the second EFEM 20 and another part of the wafer transfer chamber 40 may be connected to a plurality of the wafer processing chamber 60.

In an embodiment, the wafer transfer chamber 40 may be provided between the first EFEM 10 and the second EFEM 20. Internal pressure of the wafer transfer chamber 40 may be controlled to be substantially the same as or similar to those of the plurality of the wafer processing chamber 60. For example, the internal pressure of the wafer transfer chamber 40 may be controlled to be a vacuum pressure.

The wafer transfer arm 50 may be configured to be moved within the wafer transfer chamber 40 in the horizontal direction (e.g., a Y-axis direction). The wafer transfer arm 50 may be configured to unload wafers from the first load lock 130 of the first EFEM 10 and the second load lock 230 of the second EFEM 20 and load the wafers into the wafer processing chamber 60, and unload wafers processed in the wafer processing chamber 60 and load the wafers into the first load lock 130 of the first EFEM 10 and the second load lock 230 of the second EFEM 20.

In an embodiment, the wafer transfer arm 50 may include a robot arm configured to handle a wafer.

The wafer processing chamber 60 may provide a space in which wafers delivered from the first EFEM 10 and the second EFEM 20 are processed. In an embodiment, a plurality of the wafer processing chamber 60 may be provided.

In an embodiment, when the wafer processing apparatus 1 is viewed from a plan view, some of the plurality of the wafer processing chamber 60 may be arranged to overlap the first EFEM 10 in the Y-axis direction and some of the plurality of the wafer processing chamber 60 may be arranged to overlap the second EFEM 20 in the Y-axis direction.

A plurality of first processing boxes 69 may be provided on the wafer processing chamber 60. Some of the plurality of processing boxes 69 may accommodate components for plasma processing, and some of the plurality of processing boxes 69 may store gases for plasma processing.

A plurality of second processing boxes 67 may be provided below the wafer processing chamber 60. The plurality of second processing boxes 67 may accommodate components for processing wafers in the wafer processing chamber 60. For example, the plurality of second processing boxes 67 may accommodate plasma equipment.

The EFEM connection device 70 may be provided between the first EFEM 10 and the second EFEM 20 to spatially connect the first EFEM chamber 110 to the second EFEM chamber 210. In an embodiment, the EFEM connection device 70 may include a wafer transfer tunnel 710 and a wafer transfer stage 730.

In an embodiment, the wafer transfer tunnel 710 may connect the first EFEM chamber 110 to the second EFEM chamber 210. The wafer transfer stage 730 may be configured to be moved within the wafer transfer tunnel 710 in the horizontal direction (e.g., the X-axis direction) to transfer a wafer in the horizontal direction. For example, through the wafer transfer stage 730, a wafer may be transferred to the second EFEM chamber 210 from the first EFEM chamber 110 or to the first EFEM chamber 110 from the second EFEM chamber 210.

The wafer processing apparatus 1 according to an embodiment of the present disclosure may include the EFEM connection device 70 and thus the wafer processing apparatus 1 is capable of continuously performing a wafer processing process even when a defect occurs in at least one among the components of the first EFEM 10 and the components of the second EFEM 20.

For example, when a defect occurs in the first load lock 130 of the first EFEM 10, the first wafer loaded into the first EFEM chamber 110 may be moved to the second EFEM chamber 210 through the EFEM connection device 70 and loaded into the second load lock 230 of the second EFEM 20. Accordingly, the wafer processing efficiency of the wafer processing apparatus 1 may be improved.

Figure 4:
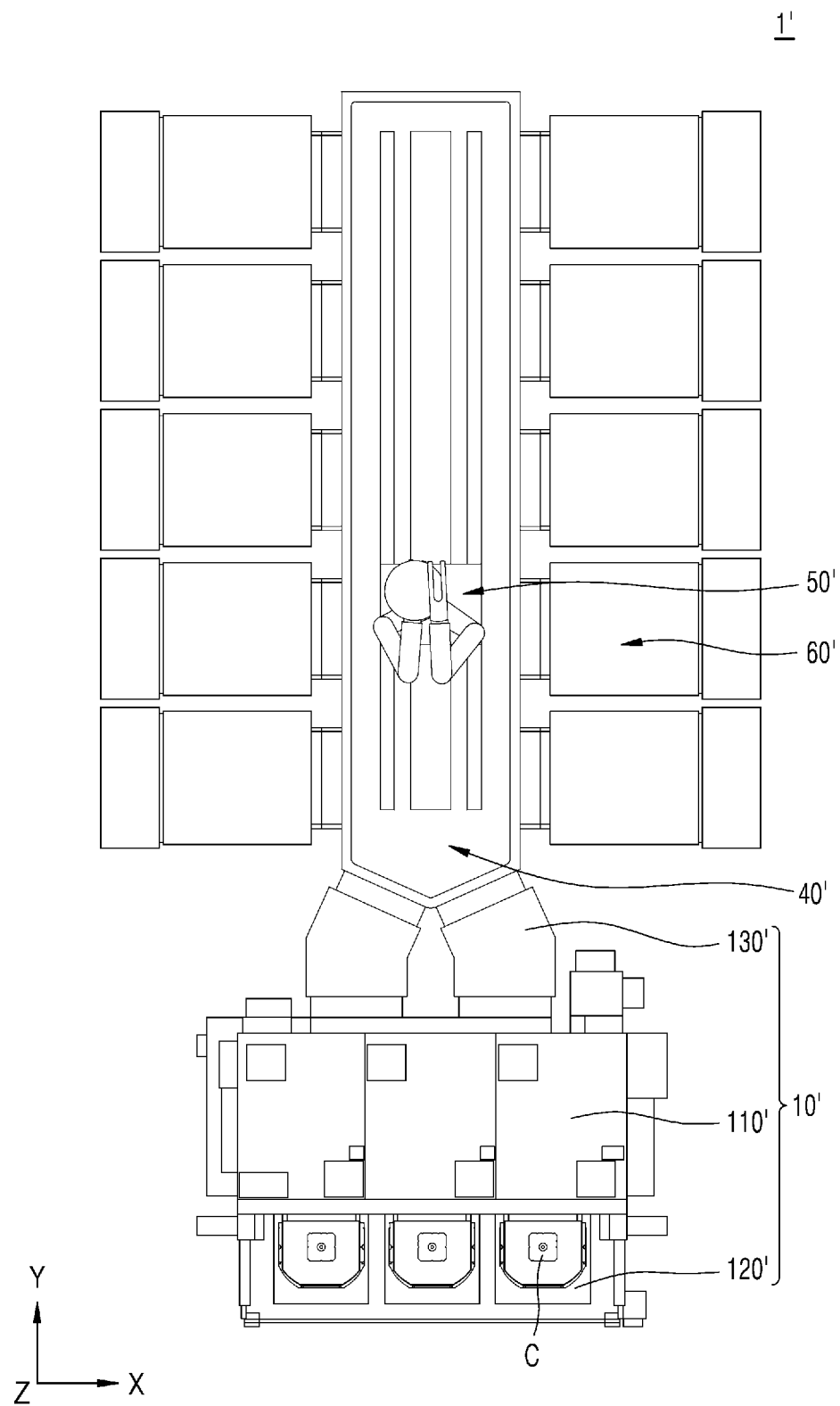
FIG. 4 is a cross-sectional view of a wafer processing apparatus according to a comparative example.

FIG. 4 is a cross-sectional view of a wafer processing apparatus 1' according to a comparative example.

Referring to FIG. 4, the wafer processing apparatus 1' of the comparative example may include an EFEM 10' including an EFEM chamber 110', a load port 120', and a load lock 130', a wafer transfer chamber 40', a wafer transfer arm 50', and a wafer processing chamber 60'.

When the wafer processing apparatus 1' of the comparative example is viewed from a plan view, the load port 120' may be located on a front surface of the EFEM chamber 110' and the load lock 130' may be located on a rear surface of the EFEM chamber 110'. That is, when the wafer processing apparatus 1' is viewed from a plan view, the load lock 130' may not overlap the load port 120' in the vertical direction. Accordingly, the wafer processing apparatus 1' may be provided in a relatively large size. For example, a length of the wafer processing apparatus 1' may be relatively large.

The load locks (e.g., the first load lock 130 and the second load lock 230) of the wafer processing apparatus 1 of an embodiment of the present disclosure described above with reference to FIGS. 1 to 3 may overlap at least one of the load ports (e.g., the first inner load port 120a, the first outer load port 120b, the second inner load port 220a, and the second outer load port 220b) in the vertical direction, and thus, the size of the wafer processing apparatus 1 of an embodiment of the present disclosure may be less than that of the wafer processing apparatus 1' of the comparative example. For example, a length of the wafer processing apparatus 1 of an embodiment of the present disclosure in the Y-axis direction may be less than that of the wafer processing apparatus 1' of the comparative example in the Y-axis direction. Accordingly, the wafer processing efficiency per unit area of the wafer processing apparatus 1 of an embodiment of the present disclosure may be improved.

Figure 5A:
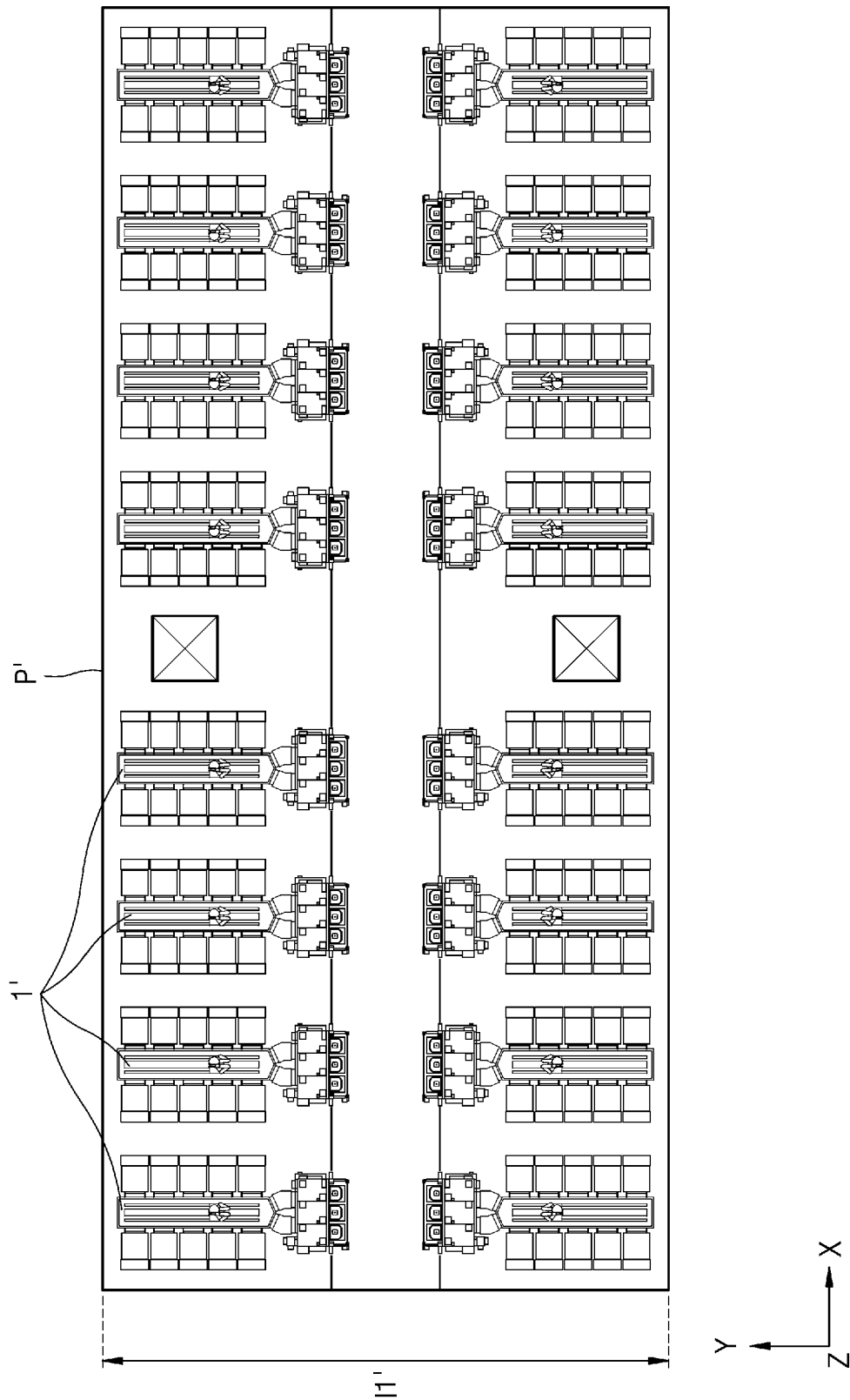
FIG. 5A is a plan view of a process chamber for accommodating a wafer processing apparatus according to a comparative example.
Figure 5B:
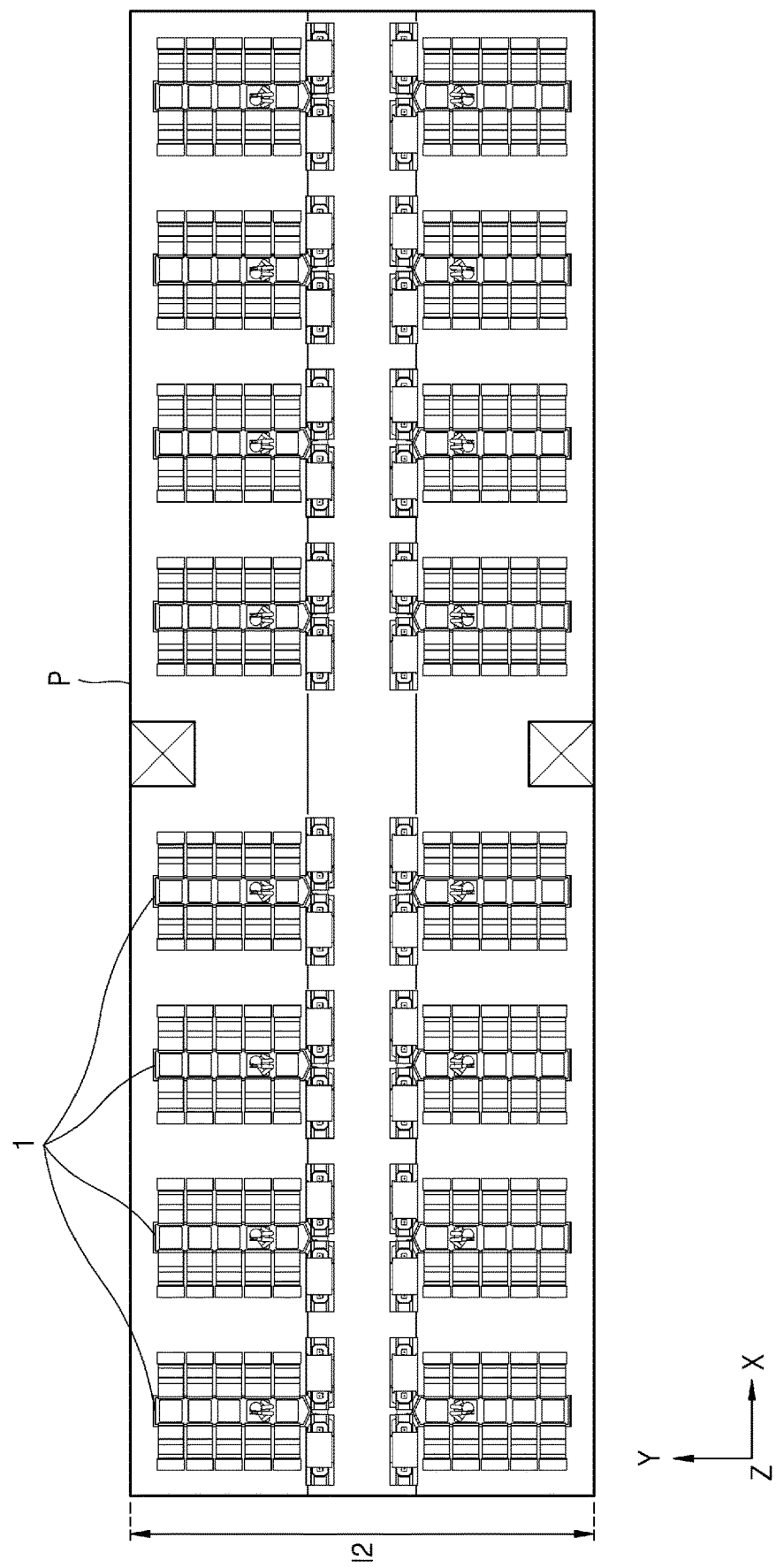
FIG. 5B is a plan view of a process chamber for accommodating a wafer processing apparatus according to an embodiment of the present disclosure.

FIG. 5A is a plan view of a process chamber P' for accommodating a plurality of the wafer processing apparatus 1' according to a comparative example. FIG. 5B is a plan view of a process chamber P for accommodating a plurality of the wafer processing apparatus 1 according to an embodiment of the present disclosure.

Referring to FIG. 5A, the process chamber P' accommodates the plurality of the wafer processing apparatus 1' according to the comparative example. When the process chamber P' is viewed from a plan view, the plurality of the wafer processing apparatus 1' may be arranged in an M×N matrix comprising or consisting of M rows and N columns, wherein M is an integer greater than or equal to 1 an N is an integer greater than or equal to 1. The plurality of the wafer processing apparatus 1' may be arranged apart from each other in the Y-axis direction, and a distance between the plurality of the wafer processing apparatus 1' in the process chamber P' in the Y-axis direction may be defined as a first distance I1'.

Referring to FIG. 5B, the process chamber P may accommodate the plurality of the wafer processing apparatus 1 according to an embodiment of the present disclosure. When the process chamber P is viewed from a plan view, the plurality of the wafer processing apparatus 1 may be arranged in an M×N matrix comprising or consisting of M rows and N columns, wherein M is an integer greater than or equal to 1 an N is an integer greater than or equal to 1. The plurality of the wafer processing apparatus 1 may be arranged apart from each other in the Y-axis direction, and a distance between the plurality of the wafer processing apparatus 1' in the process chamber P in the Y-axis direction may be defined as a second distance I2.

The load locks (e.g., the first load lock 130 and the second load lock 230) of the wafer processing apparatus 1 of an embodiment of the present disclosure may be arranged to overlap at least one of the plurality of load ports (e.g., the first inner load port 120a, the first outer load port 120b, the second inner load port 220a, and the second outer load port 220b) in the vertical direction, thereby reducing the length of the wafer processing apparatus 1 in the Y-axis direction.

That is, the second distance I1 between the plurality of the wafer processing apparatus 1 of an embodiment of the present disclosure in the Y-axis direction in the process chamber P may be shorter than the first distance I1' between the plurality of the wafer processing apparatus 1' in the Y-axis direction in the process chamber P'. In addition, an area of the process chamber P occupied by the plurality of the wafer processing apparatus 1 of an embodiment of the present disclosure in the Y-axis direction may be less than an area of the process chamber P' occupied by the plurality of the wafer processing apparatus 1' of the comparative example in the Y-axis direction. Accordingly, the wafer processing efficiency per unit area of the plurality of the wafer processing apparatus 1 of an embodiment of the present disclosure may be higher than the wafer processing efficiency per unit area of the plurality of the wafer processing apparatus 1' of the comparative example.

Figure 6:
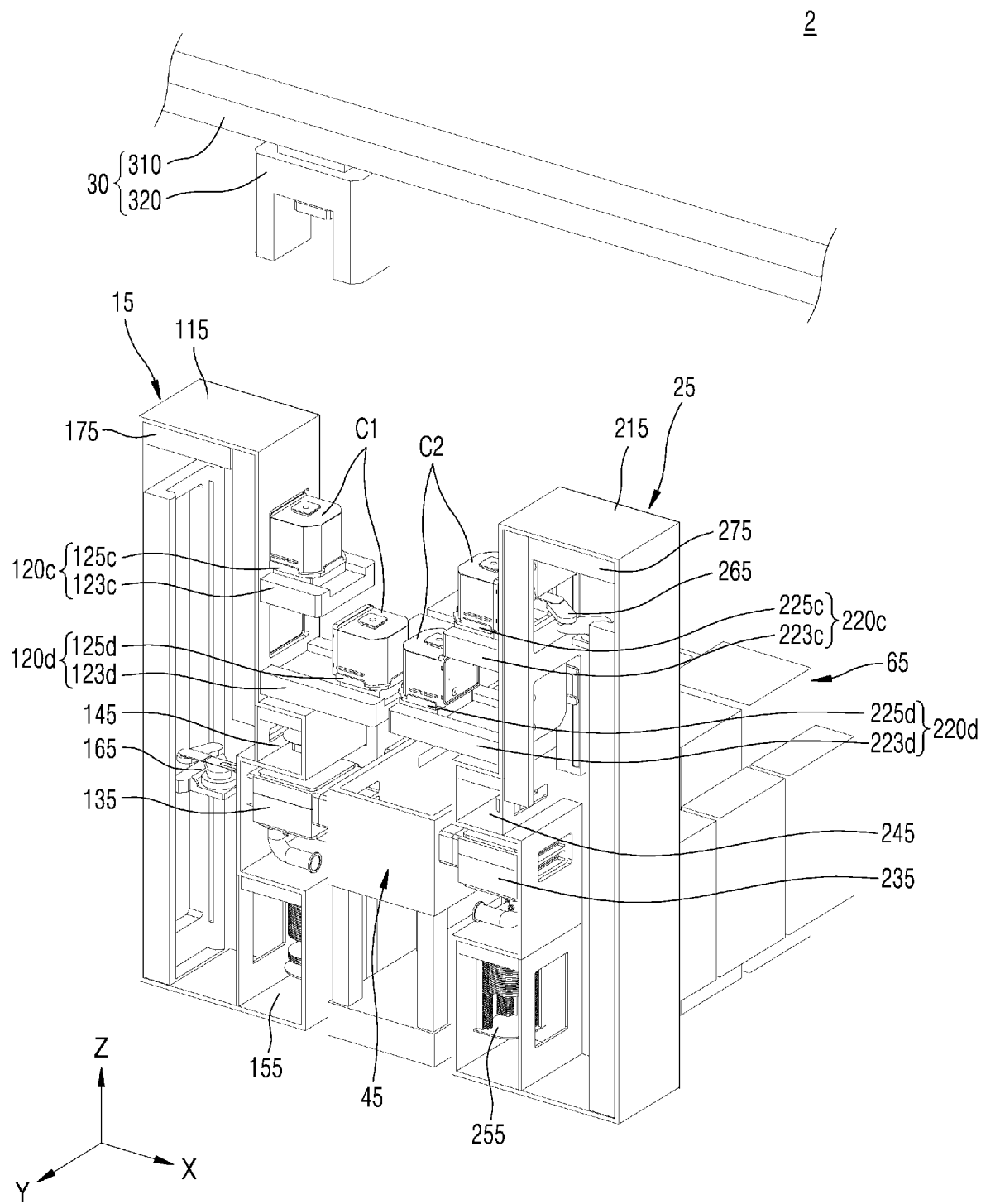
FIG. 6 is a perspective view of a wafer processing apparatus according to an embodiment of the present disclosure.

FIG. 6 is a perspective view of a wafer processing apparatus 2 according to an embodiment of the present disclosure.

Referring to FIG. 6, the wafer processing apparatus 2 according to an embodiment of the present disclosure may include a wafer carrier transfer device 30, a first EFEM 15, a second EFEM 25, a wafer transfer chamber 45, a wafer transfer arm (not shown), and a wafer processing chamber 65. The wafer processing apparatus 2 of FIG. 6 will be described below by focusing on differences from the wafer processing apparatus 1 of FIGS. 1 to 3 while omitting some description of parts of the wafer processing apparatus 2 that are the same as those of the wafer processing apparatus 1.

The wafer carrier transfer device 30 may be provided above the first EFEM 15 and the second EFEM 25 and configured to transfer a wafer carrier C. In an embodiment, the wafer carrier transfer device 30 may include a wafer carrier transfer line 310 and a wafer carrier transfer robot 320.

The first EFEM 15 may include a first EFEM chamber 115, a first upper load port 120c, a first lower load port 120d, a first load lock 135, a first wafer aligner 145, a first wafer buffer device 155, a first EFEM arm 165, a first air supply device 175, etc.

The first upper load port 120c and the first lower load port 120d may be provided at sides of the first EFEM chamber 115 and configured to support a first wafer carrier C1. The first upper load port 120c and the first lower load port 120d may be configured to transfer the first wafer carrier C1 in the horizontal direction (e.g., an X-axis direction) and rotate the first wafer carrier C1 about a rotational axis parallel to the vertical direction (e.g., the Z-axis direction).

In an embodiment, at least a part of the first lower load port 120d may be overlapped by the first upper load port 120c in the vertical direction. When the wafer processing apparatus 2 is viewed from a plan view, a planar area of the first lower load port 120d may be provided to be larger than that of the first upper load port 120c. That is, a part of the first lower load port 120d may be overlapped by the first upper load port 120c in the vertical direction but another part thereof may not be overlapped by the first upper load port 120c in the vertical direction.

In an embodiment, when the wafer processing apparatus 2 is viewed from a plan view, at least a part of the first lower load port 120d may overlap the wafer transfer chamber 45 to be described below in the vertical direction.

The first upper load port 120c may include a first upper transfer rail 123c provided at a side of the first EFEM chamber 115, and a first upper transfer tray 125c provided on the first upper transfer rail 123c. The first upper transfer tray 125c may be configured to move in the horizontal direction and be rotated about a rotational axis parallel to the vertical direction. The first lower load port 120d may include a first lower transfer rail 123d provided at a side of the first EFEM chamber 115, and a first lower transfer tray 125d provided on the first lower transfer rail 123d. The first lower transfer tray 125d may be configured to move in the horizontal direction and be rotated about a rotational axis parallel to the vertical direction.

The first load lock 135 may be provided at a side of the first EFEM chamber 115 to be overlapped by the first upper load port 120c and the first lower load port 120d in the vertical direction.

The first wafer aligner 145 may be provided at a side of the first EFEM chamber 115 to be overlapped by the first upper load port 120c and the first lower load port 120d in the vertical direction, and configured to arrange a first wafer. In addition, the first wafer aligner 145 may overlap the first load lock 135 in the vertical direction.

The first wafer buffer device 155 may be provided at a side of the first EFEM chamber 115 to be overlapped by the first upper load port 120c and the first lower load port 120d in the vertical direction. The first wafer buffer device 155 may be configured to temporarily accommodate the first wafer. The first wafer buffer device 155 may be overlapped by the first load lock 135 and the first wafer aligner 145 in the vertical direction.

The first EFEM arm 165 may be configured to be moved within the first EFEM chamber 115. The first EFEM arm 165 may be configured to unload the first wafer from the first wafer carrier C1 and supply the first wafer to the first load lock 130, and unload the first wafer from the first load lock 135 and provide the first wafer to the first wafer carrier C1. In an embodiment, the first EFEM arm 165 may include a robot arm configured to handle a wafer.

The first air supply device 175 may be provided inside the first EFEM chamber 115 and configured to purify an inner space of the first EFEM chamber 115. In an embodiment, the first air supply device 175 may include an FFU comprising or consisting of a fan, a suction duct, an exhaust duct, a filter, etc.

The second EFEM 25 may include a second EFEM chamber 215, a second upper load port 220c, a second lower load port 220d, a second load lock 235, a second wafer aligner 245, a second wafer buffer device 255, a second EFEM arm 265, a second air supply device 275, etc.

The second upper load port 220c and the second lower load port 220d may be provided at sides of the second EFEM chamber 215 and configured to support a second wafer carrier C2. The second upper load port 220c and the second lower load port 220d may be configured to transfer the second wafer carrier C2 in the horizontal direction (e.g., the X-axis direction) and rotate the second wafer carrier C2 about a rotational axis parallel to the vertical direction (e.g., the Z-axis direction).

In an embodiment, at least a part of the second lower load port 220d may be overlapped by the second upper load port 220c in the vertical direction. When the wafer processing apparatus 2 is viewed from a plan view, a planar area of the second lower load port 220d may be provided to be larger than that of the second upper load port 220c. That is, a part of the second lower load port 220d may be overlapped by the second upper load port 220c in the vertical direction but another part of the second lower load port 220d may not be overlapped by the second upper load port 220c in the vertical direction.

In an embodiment, when the wafer processing apparatus 2 is viewed from a plan view, at least a part of the second lower load port 220d may overlap the wafer transfer chamber 45 to be described below in the vertical direction.

The second upper load port 220c may include a second upper transfer rail 223c provided at a side of the second EFEM chamber 215, and a second upper transfer tray 225c provided on the second upper transfer rail 223c. The second upper transfer tray 225c may be configured to move in the horizontal direction and rotate about a rotational axis parallel to the vertical direction. The second upper load port 220c may include a second lower transfer rail 223d provided at a side of the second EFEM chamber 215, and a second lower transfer tray 225d provided on the second lower transfer rail 223d. The second lower transfer tray 225d may be configured to move in the horizontal direction and rotate about a rotational axis parallel to the vertical direction.

The second load lock 235 may be provided at a side of the second EFEM chamber 215 to be overlapped by the second upper load port 220c and the second lower load port 220d in the vertical direction.

The second wafer aligner 245 may be provided at a side of the second EFEM chamber 215 to be overlapped by the second upper load port 220c and the second lower load port 220d in the vertical direction, and configured to arrange a second wafer. In addition, the second wafer aligner 245 may overlap the second load lock 235 in the vertical direction.

The second wafer buffer device 255 may be provided at a side of the second EFEM chamber 215 to be overlapped by the second upper load port 220c and the second lower load port 220d in the vertical direction. The second wafer buffer device 255 may be configured to temporarily accommodate the second wafer. The second wafer buffer device 255 may be overlapped by the second load lock 235 and the second wafer aligner 245 in the vertical direction.

The second EFEM arm 265 may be configured to be moved within the second EFEM chamber 215. The second EFEM arm 265 may unload the second wafer from the second wafer carrier C2 and supply the second wafer to the second load lock 235, and unload the second wafer from the second load lock 235 and supply the second wafer to the second wafer carrier C2. In an embodiment, the second EFEM arm 265 may include a robot arm configured to handle a wafer.

The second air supply device 275 may be provided inside the second EFEM chamber 215 and configured to purify an inner space of the second EFEM chamber 215. In an embodiment, the second air supply device 275 may include an FFU comprising or consisting of a fan, a suction duct, an exhaust duct, a filter, etc.

In an embodiment, the first upper load port 120c, the first lower load port 120d, the first load lock 135, the first wafer aligner 145, and the first wafer buffer device 155 of the first EFEM 15 may respectively face the second upper load port 220c, the second lower load port 220d, the second load lock 235, the second wafer aligner 245, and the second wafer buffer device 255 of the second EFEM 25.

The wafer transfer chamber 45 may provide a space of transfer of the first wafer and the second wafer, which are delivered from the first EFEM 15 and the second EFEM 25, to the wafer processing chamber 65. In an embodiment, a part of the wafer transfer chamber 45 may be connected to the first load lock 135 of the first EFEM 15 and the second load lock 235 of the second EFEM 25 and another part thereof may be connected to a plurality of the wafer processing chamber 65.

In an embodiment, when the wafer processing apparatus 2 is viewed from a plan view, the wafer transfer chamber 45 may be provided between the first EFEM 15 and the second EFEM 25 such that at least a part of the wafer transfer chamber 45 is overlapped by at least a part of the first lower load port 120d and at least a part of the second lower load port 220d in the vertical direction.

A wafer transfer arm (not shown) may be configured to be moved within the wafer transfer chamber 45 in the horizontal direction (e.g., the Y-axis direction). The wafer transfer arm may be configured to unload wafers from the first load lock 135 of the first EFEM 15 and the second load lock 235 of the second EFEM 25 and load wafers into the wafer processing chamber 65, and unload wafers processed in the wafer processing chamber 65 and load the wafers into the first load lock 135 of the first EFEM 15 and the second load lock 235 of the second EFEM 25.

The wafer processing chamber 65 may provide a space in which wafers delivered from the first EFEM 15 and the second EFEM 25 are processed. In an embodiment, a plurality of the wafer processing chamber 65 may be provided.

The first lower load port 120d may be overlapped by the first upper load port 120c in the vertical direction, and the second lower load port 220d may be overlapped by the second upper load port 220c in the vertical direction. The first load lock 135 may be overlapped by the first upper load port 120c and the first lower load port 120d in the vertical direction, and the second load lock 235 may overlap the second upper load port 220c and the second lower load port 220d in the vertical direction. At least a part of the wafer transfer chamber 45 may be overlapped by at least a part of the first lower load port 120d and the second lower load port 220d in the vertical direction.

Accordingly, the wafer processing efficiency per unit area of the wafer processing apparatus 2 including the first EFEM 15 and the second EFEM 25 may be improved.

In an embodiment, unlike that shown in FIG. 6, the wafer processing apparatus 2 may further include an EFEM connection device (not shown). The EFEM connection device may be provided between the first EFEM 15 and the second EFEM 25 to spatially connect the first EFEM chamber 115 to the second EFEM chamber 215.

In an embodiment, the EFEM connection device may include a wafer transfer tunnel and the wafer transfer stage. The EFEM connection device is as described above with reference to FIGS. 1 to 3 and thus a detailed description thereof is omitted here.

A wafer processing method using a wafer processing apparatus 1 according to an embodiment of the present disclosure will be described in detail below.

FIGS. 7A to 7E are diagrams illustrating operations of a wafer processing method according to an embodiment of the present disclosure.

Figure 7A:
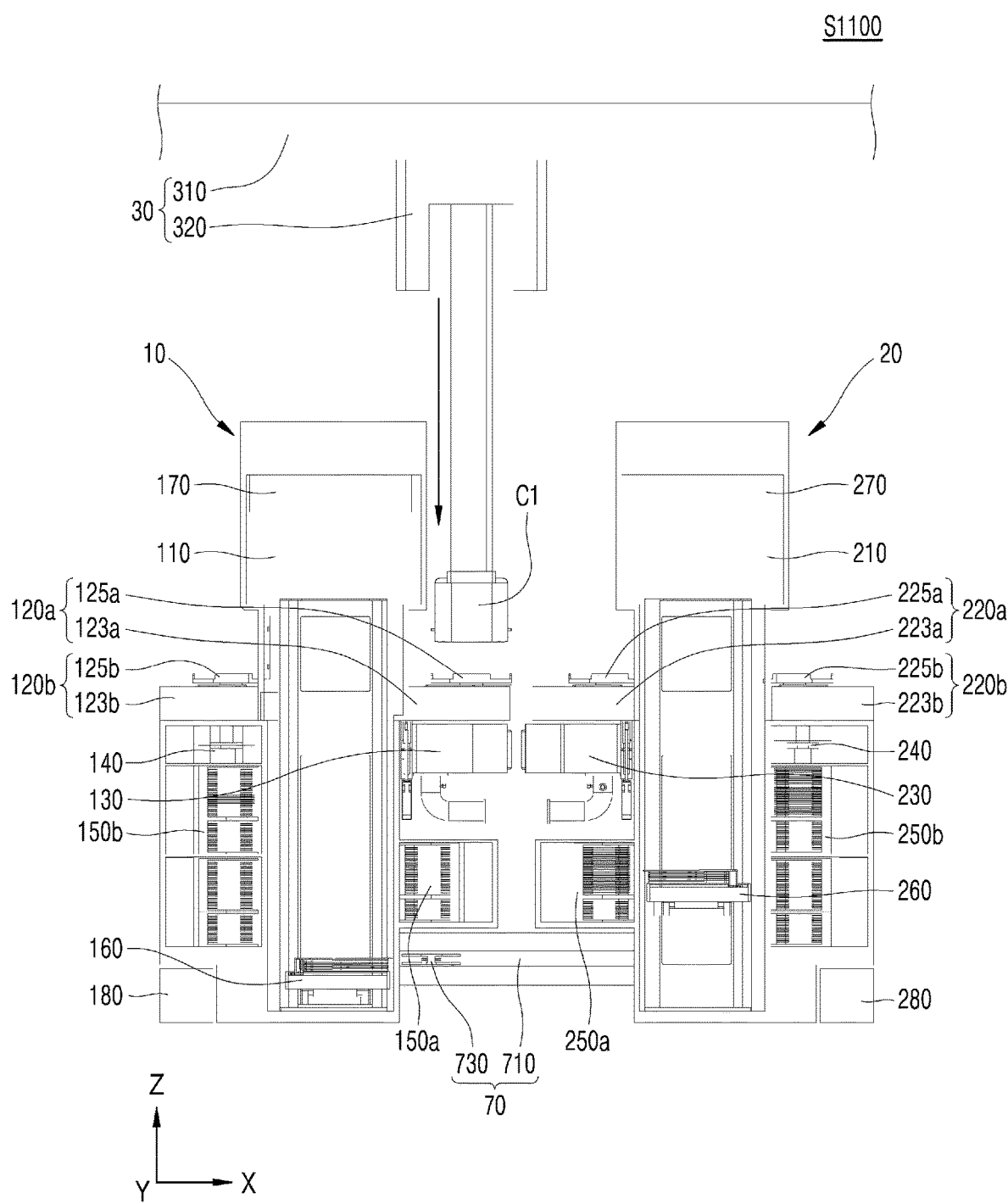
FIG. 7A is a diagram illustrating an operation of a wafer processing method according to an embodiment of the present disclosure.

Referring to FIG. 7A, the wafer processing method according to an embodiment of the present disclosure may include loading a first wafer carrier C1 in at least one of the first inner load port 120a and the first outer load port 120b (S1100).

In an embodiment, in operation S1100, a wafer carrier transfer robot 320 of a wafer carrier transfer device 30 may move in the horizontal direction and the vertical direction to load the first wafer carrier C1 in at least one of the first inner load port 120a and the first outer load port 120b. For example, the wafer carrier transfer robot 320 may provide the first wafer carrier C1 to the first inner load port 120a.

Figure 7B:
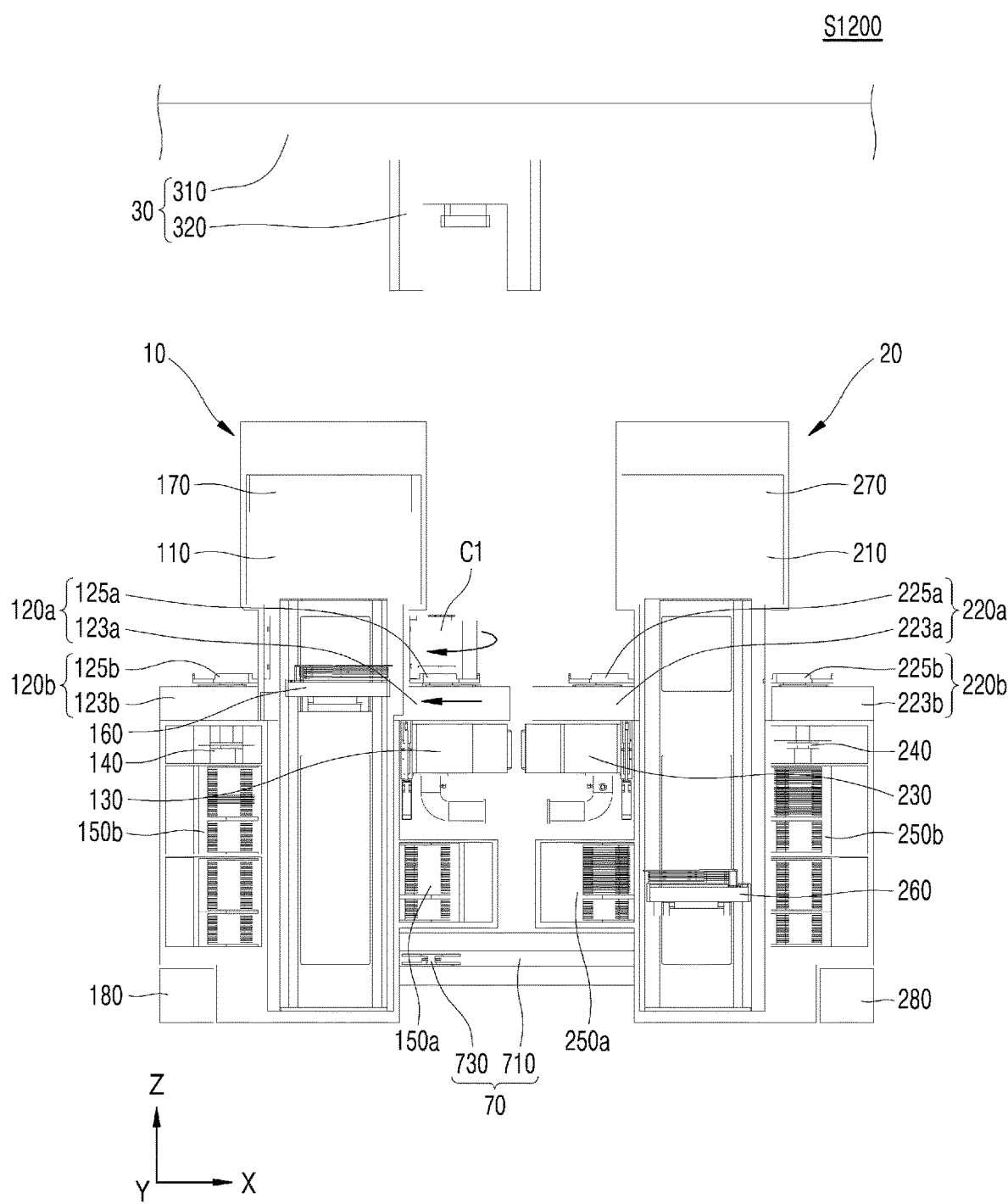
FIG. 7B is a diagram illustrating an operation of the wafer processing method according to the embodiment of the present disclosure.

Referring to FIG. 7B, the wafer processing method according to the embodiment of the present disclosure may include operating the first inner load port 120a and the first outer load port 120b to connect the first wafer carrier C1 to the first EFEM chamber 110 (S1200).

In an embodiment, in operation S1200, in order to connect the first wafer carrier C to the first EFEM chamber 110, a first inner transfer tray 125a supporting the first wafer carrier C1 may be moved in the horizontal direction along the first inner transfer rail 123a and rotated about a rotational axis parallel to the vertical direction.

After the first wafer carrier C1 is connected to the first EFEM chamber 110, a door of the first wafer carrier C1 may be opened. When the door of the first wafer carrier C1 is opened, an inner space of the first wafer carrier C1 may be connected to an inner space of the first EFEM chamber 110.

Figure 7C:
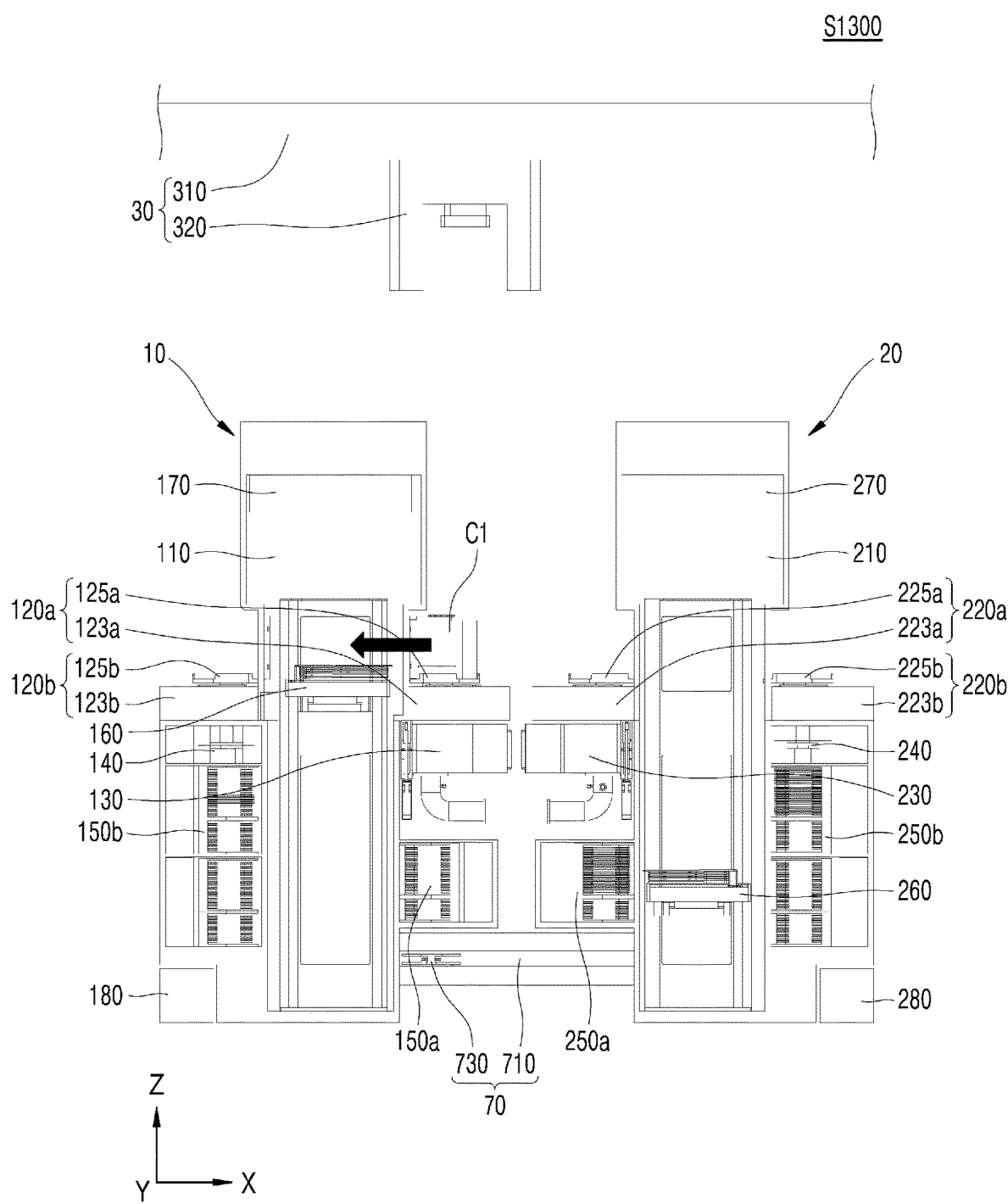
FIG. 7C is a diagram illustrating an operation of the wafer processing method according to the embodiment of the present disclosure.

Referring to FIG. 7C, the wafer processing method according to the embodiment of the present disclosure may include unloading a first wafer from the first wafer carrier C1 using a first EFEM arm 160 configured to be moved within the first EFEM chamber 110 in the vertical direction (S1300).

In an embodiment, in operation S1300, the first EFEM arm 160 may be moved in the vertical direction until the first EFEM arm 160 is located at the same level as the first wafer carrier C1. In addition, the first EFEM arm 160 may be moved in the horizontal direction to unload the first wafer from the first wafer carrier C1.

Figure 7D:
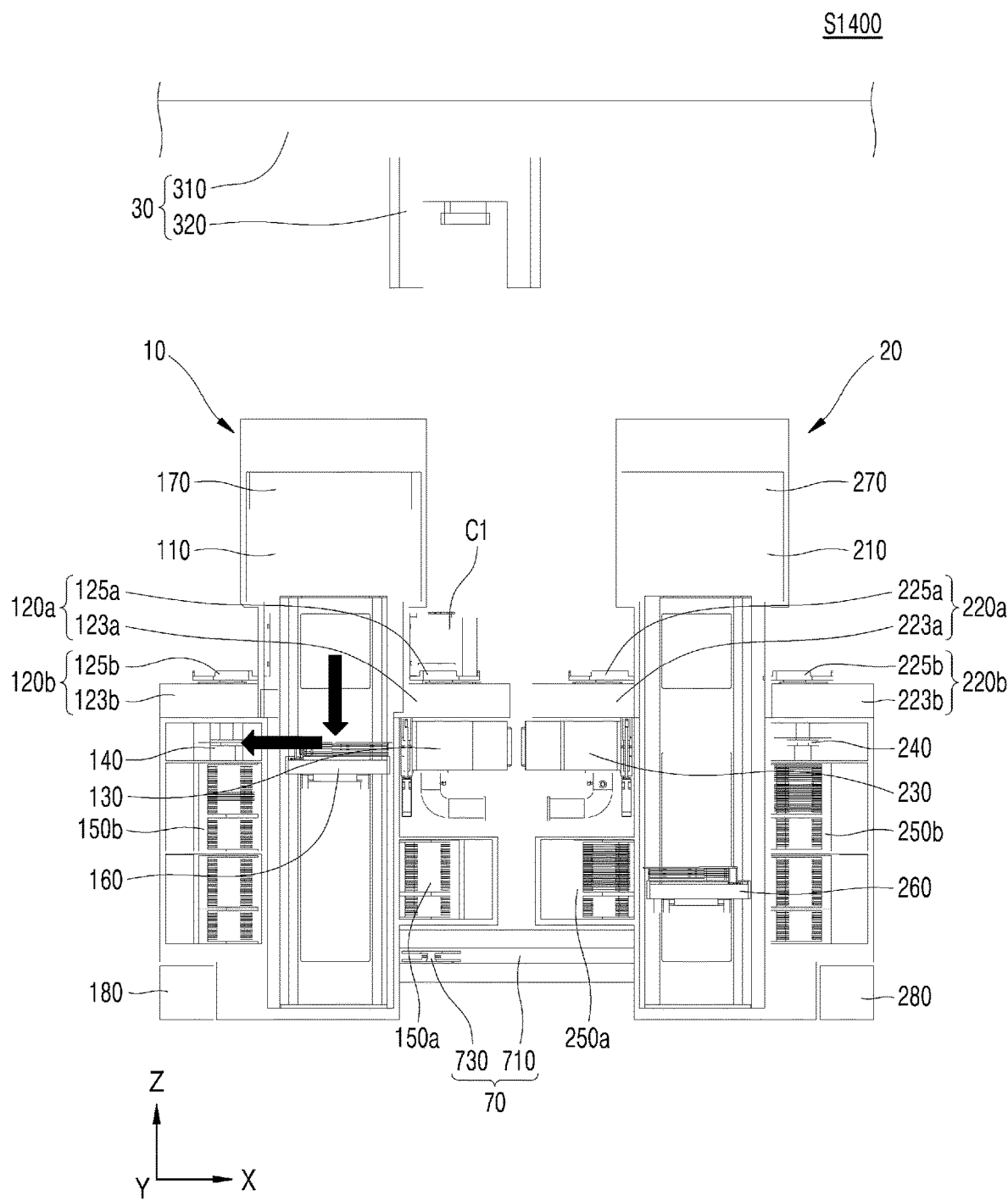
FIG. 7D is a diagram illustrating an operation of the wafer processing method according to the embodiment of the present disclosure.

Referring to FIG. 7D, the wafer processing method according to the embodiment of the present disclosure may include arranging the first wafer by loading the first wafer into a first wafer aligner 140 using the first EFEM arm 160.

In an embodiment, in operation S1400, the first wafer aligner 140 may rotate the first wafer so that the first wafer is aligned in a predetermined direction. For example, the first wafer aligner 140 may sense a notch on the first wafer and rotate the first wafer, based on a position of the sensed notch.

Figure 7E:
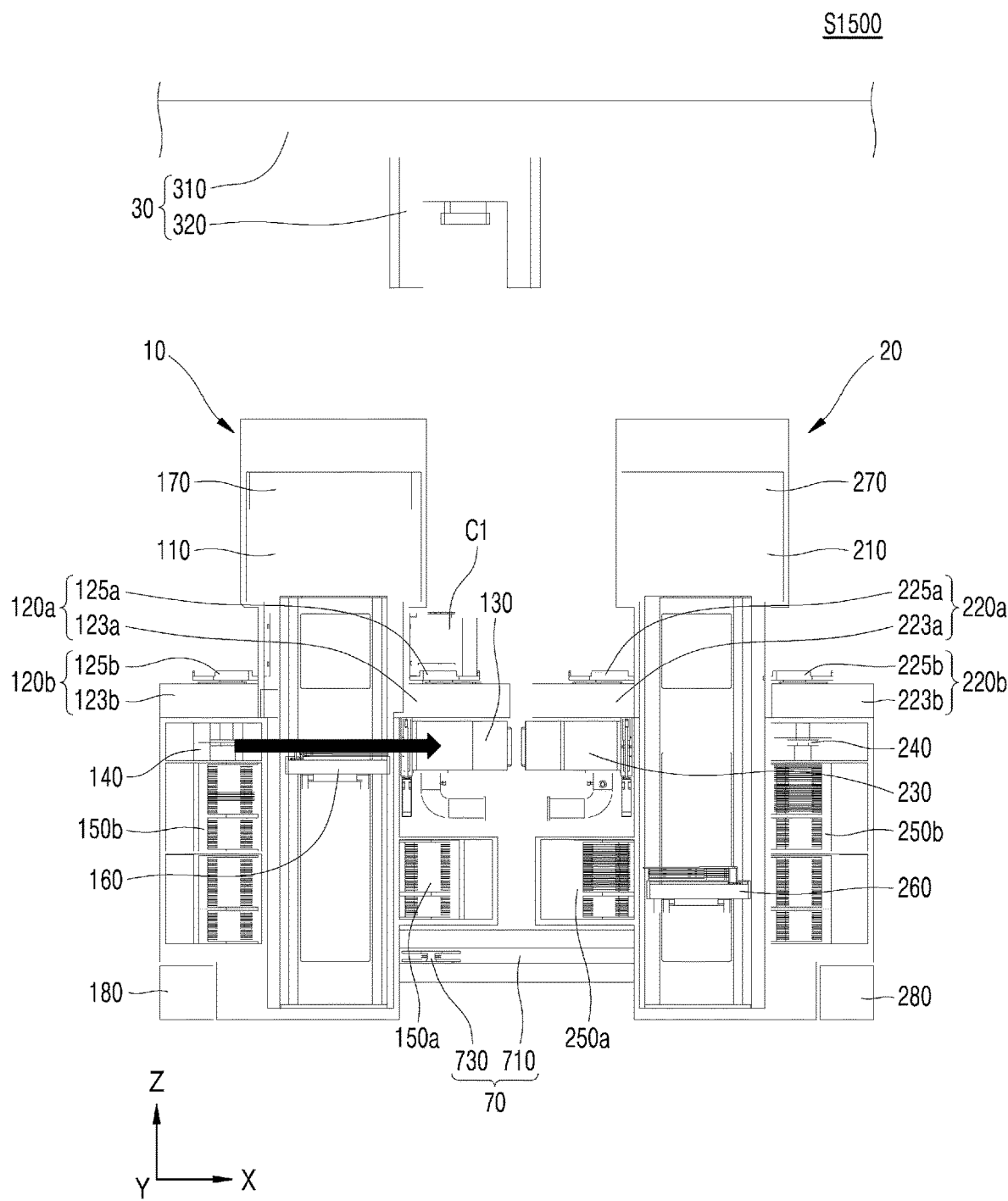
FIG. 7E is a diagram illustrating an operation of the wafer processing method according to the embodiment of the present disclosure.

Referring to FIG. 7E, the wafer processing method according to the embodiment of the present disclosure may include unloading the first wafer from the first wafer aligner 140 using the first EFEM arm 160 and loading the first wafer into the first load lock 130 located at a side of the first EFEM chamber 110 (S1500).

In an embodiment, in operation S1500, in order to transfer the first wafer, the door of the first load lock 130 may be opened to communicate a space of the first load lock 130 with a space of the EFEM chamber 11. After the first wafer is loaded into the first load lock 130, the door of the first load lock 130 may be closed.

Additionally, the wafer processing method according to the embodiment of the present disclosure includes forming pressure of the inner space of the load lock 130 to a vacuum pressure, transferring the first wafer in the first load lock 130 to the wafer processing chamber 60, processing the first wafer in the wafer processing chamber 60, and unloading the first wafer processed in the wafer processing chamber 60, and loading the processed first wafer into the first load lock 130.

Figure 8A:
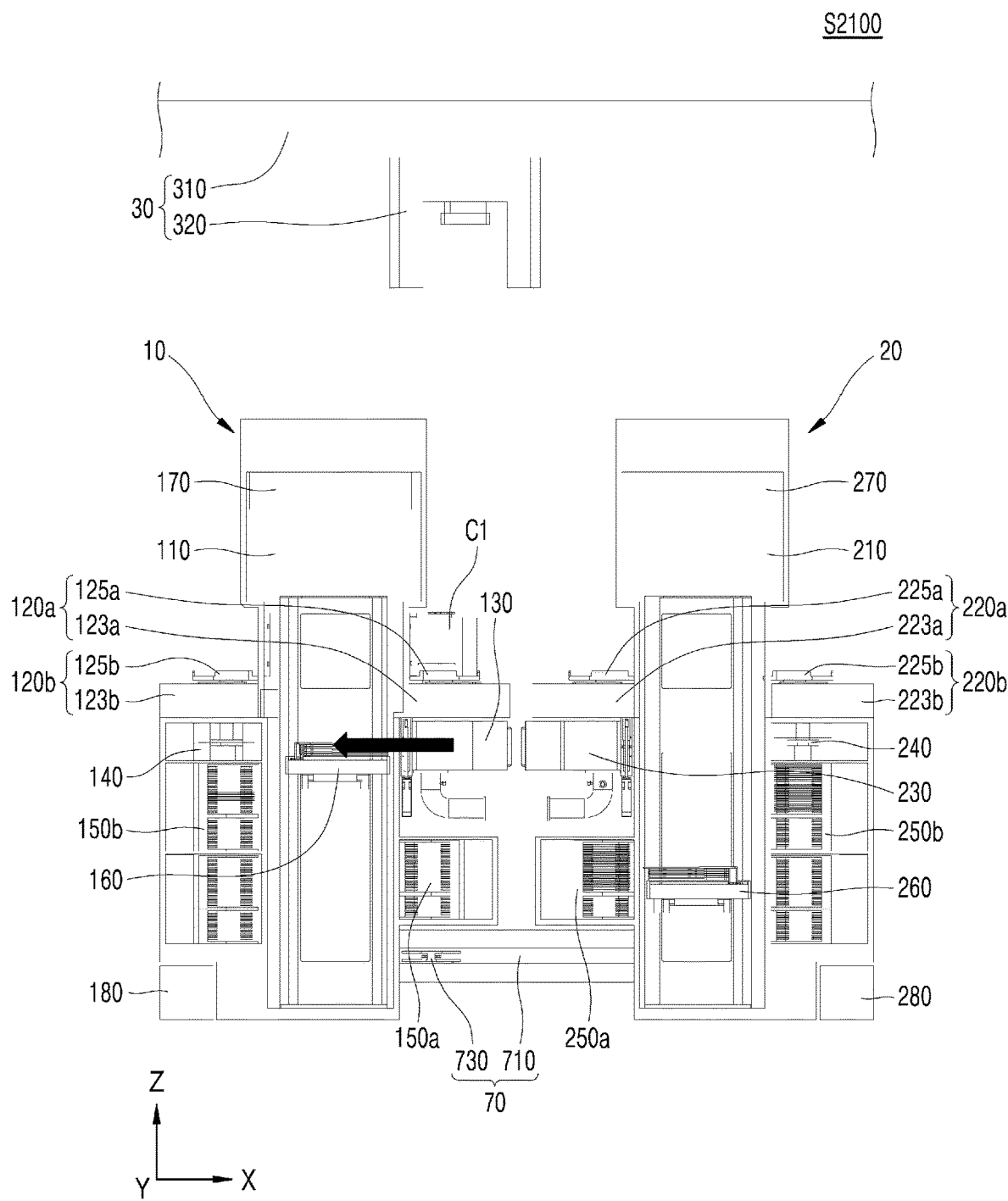
FIG. 8A is a diagram illustrating an operation of a wafer processing method according to an embodiment of the present disclosure.
Figure 8B:
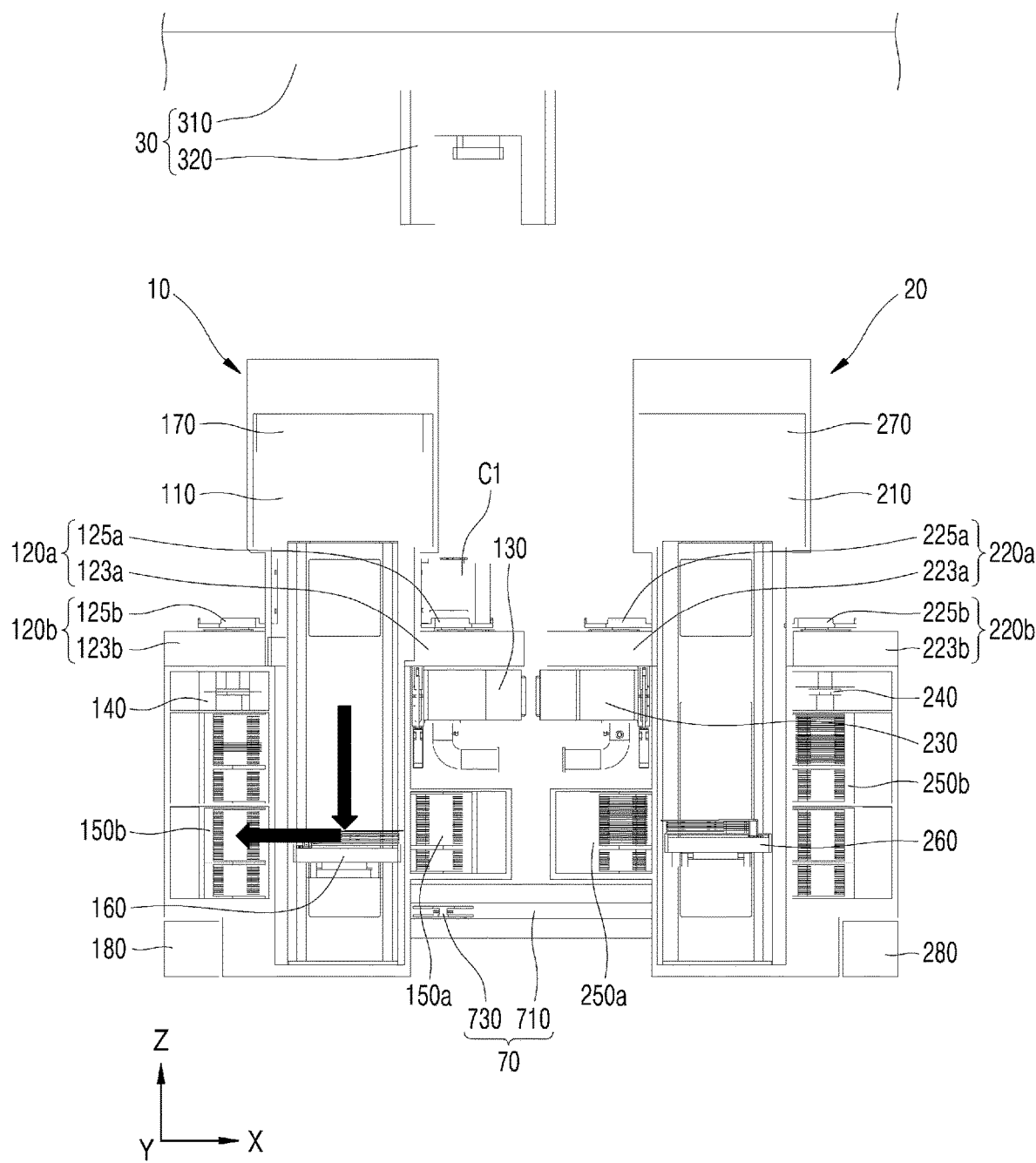
FIG. 8B is a diagram illustrating an operation of the wafer processing method according to the embodiment of the present disclosure.
Figure 8C:
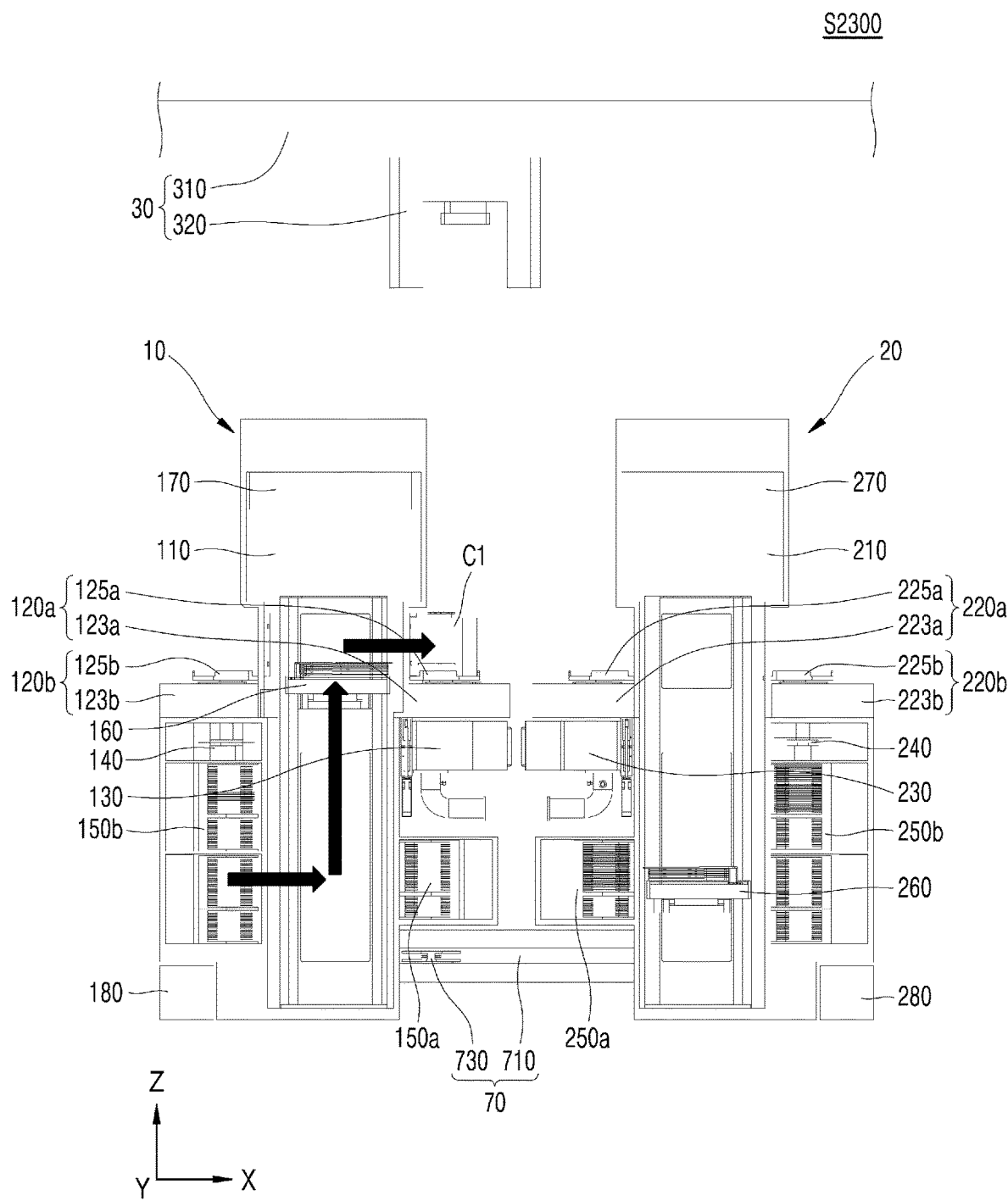
FIG. 8C is a diagram illustrating an operation of the wafer processing method according to the embodiment of the present disclosure.

FIGS. 8A to 8C are diagrams illustrating operations of a wafer processing method according to an embodiment of the present disclosure.

Referring to FIG. 8A, the wafer processing method according to the embodiment of the present disclosure may include unloading a first wafer from a first load lock 130 (S2100).

In an embodiment, operation S2100 may include adjusting pressure of an inner space of the first load lock 130 to an atmospheric pressure, opening a door of the first load lock 130, and unloading the first wafer from the first load lock 130 using a first EFEM arm 160.

Referring to FIG. 8B, the wafer processing method according to the embodiment of the present disclosure may include loading the first wafer into at least one of first inner wafer buffer device 150a and the first outer wafer buffer device 150b through the first EFEM arm 160 (S2200).

In an embodiment, in operation S2200, the first inner wafer buffer device 150a and the first outer wafer buffer device 150b may temporarily accommodate the processed first wafer. For example, the first outer wafer buffer device 150b overlapped by the first wafer aligner 140 in the vertical direction may temporarily accommodate the processed first wafer.

Referring to FIG. 8C, the wafer processing method according to the embodiment of the present disclosure may include loading the first wafer from the first inner wafer buffer device 150a and the first outer wafer buffer device 150b and loading the first wafer in a first wafer carrier C1 on at least one of the first inner load port 120a and the first outer load port 120b (S2300).

In an embodiment, when loading of the processed first wafer in the first wafer carrier C1 is completed, a door of the first wafer carrier C1 may be closed. A wafer carrier transfer robot 320 of a wafer carrier transfer device 30 may move in the vertical direction to pick up the first wafer carrier C1, and move in the horizontal direction to transfer the first wafer carrier C1 to an additional process chamber for a subsequent process.

FIGS. 9A to 9F are diagrams illustrating operations of a wafer processing method according to an embodiment of the present disclosure. Specifically, the wafer processing method of the embodiment of the present disclosure is applicable when a defect occurs in a first load lock 130 of a first EFEM 10 or when an inner space of the first load lock 130 is filled with wafers.

Figure 9A:
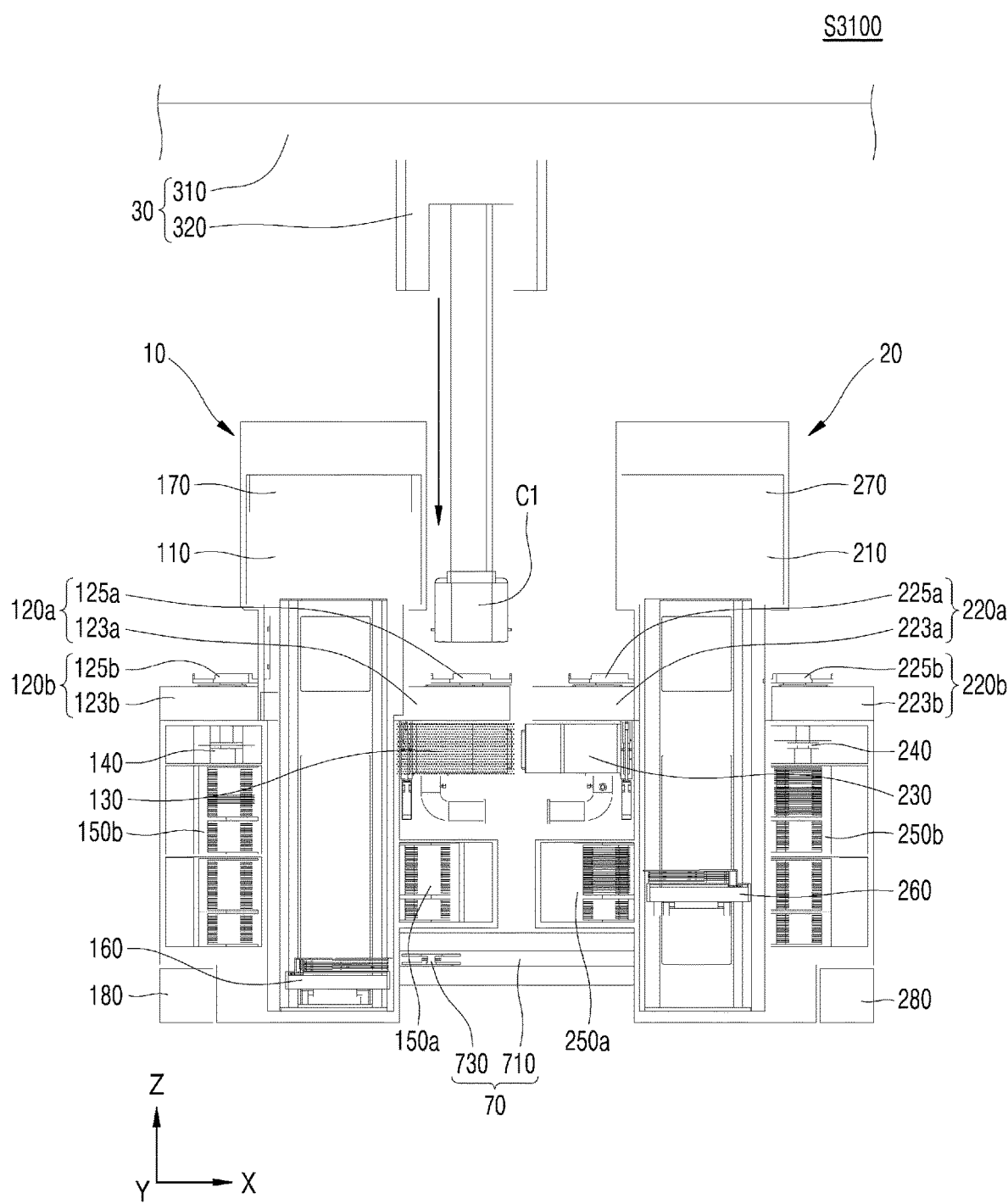
FIG. 9A is a diagram illustrating an operation of a wafer processing method according to an embodiment of the present disclosure.

Referring to FIG. 9A, the wafer processing method according to the embodiment of the present disclosure may include loading a first wafer carrier C1 in at least one of a plurality of the first inner load port 120a and the first outer load port 120b provided at sides of a first EFEM chamber 110 (S3100).

In an embodiment, in operation S3100, a wafer carrier transfer robot 320 of a wafer carrier transfer device 30 may move in the horizontal direction and the vertical direction to load the first wafer carrier C1 in at least one of the first inner load port 120a and the first outer load port 120b. For example, the wafer carrier transfer robot 320 may load the first wafer carrier C1 in the first inner load port 120a.

Figure 9B:
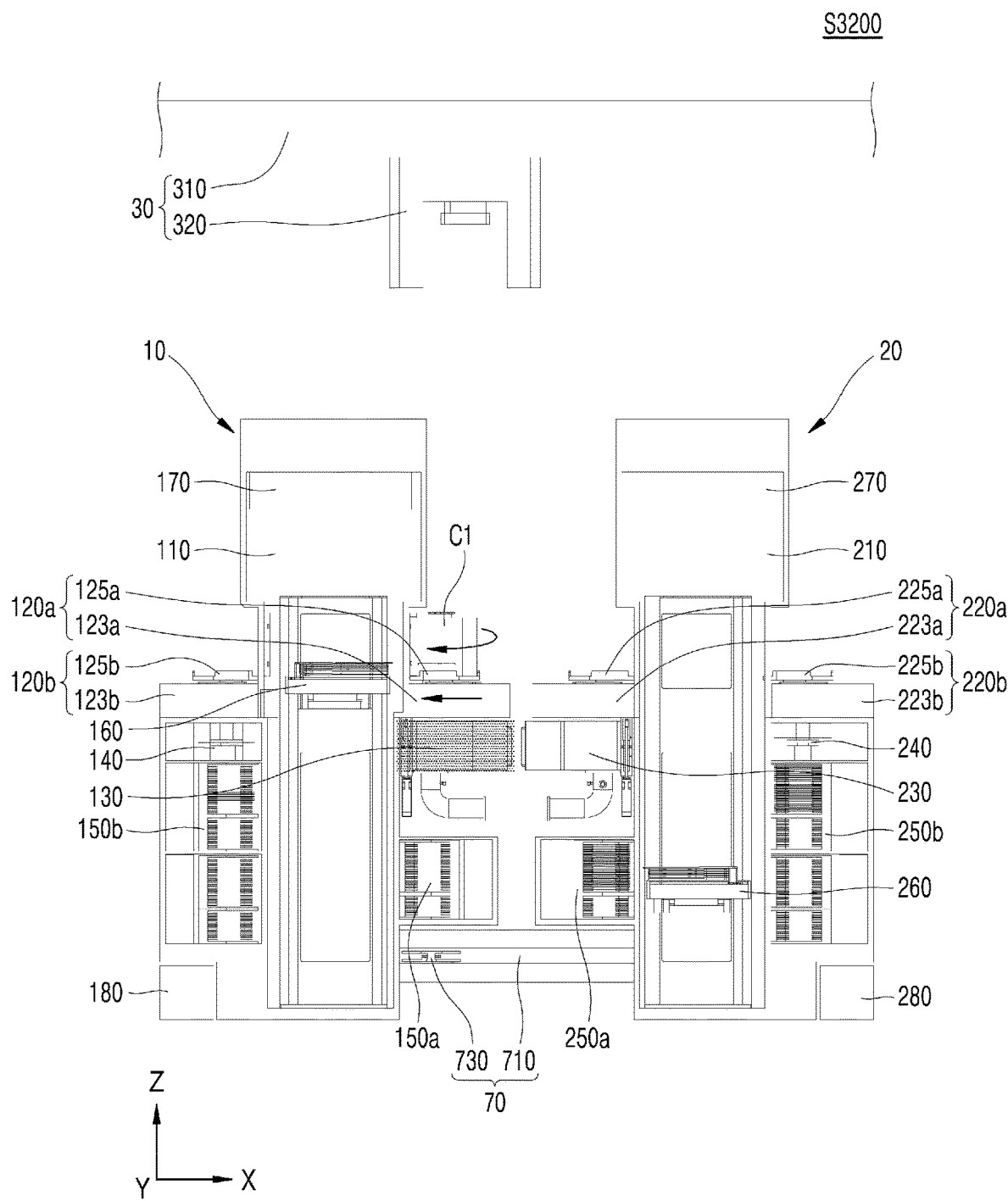
FIG. 9B is a diagram illustrating an operation of the wafer processing method according to the embodiment of the present disclosure.

Referring to FIG. 9B, the wafer processing method according to the embodiment of the present disclosure may include operating the first inner load port 120a and the first outer load port 120*b* to connect the first wafer carrier C1 to the first EFEM chamber 110 (S3200).

In an embodiment, in operation S3200, in order to connect the first wafer carrier C to the first EFEM chamber 110, a first inner transfer tray 125*a* supporting the first wafer carrier C1 may move in the horizontal direction along the first inner transfer rail 123*a* and rotate about a rotational axis parallel to the vertical direction.

After the first wafer carrier C1 is connected to the first EFEM chamber 110, a door of the first wafer carrier C1 may be opened. When the door of the first wafer carrier C1 is opened, an inner space of the first wafer carrier C1 may be connected to an inner space of the first EFEM chamber 110.

Figure 9C:
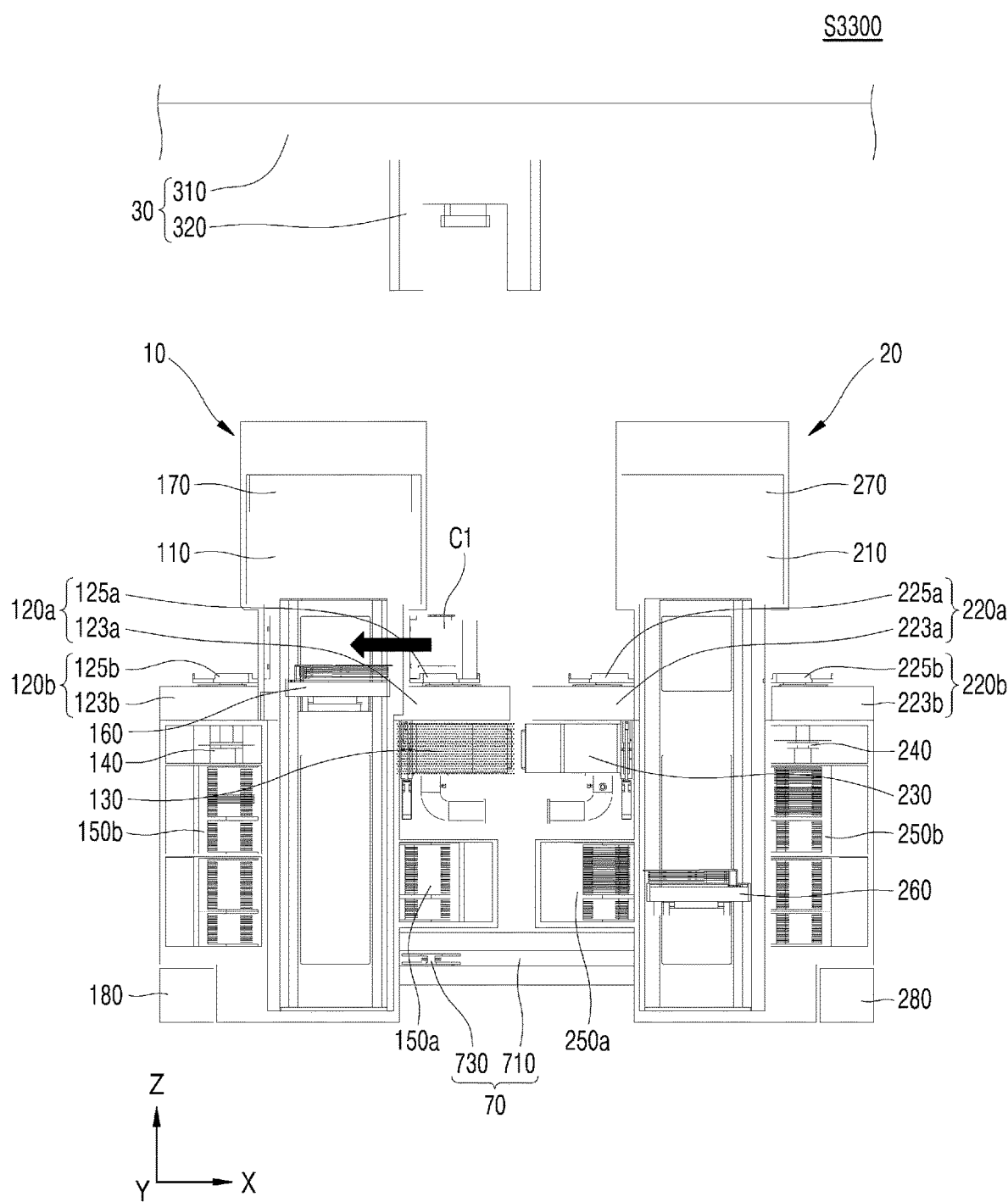
FIG. 9C is a diagram illustrating an operation of the wafer processing method according to the embodiment of the present disclosure.

Referring to FIG. 9C, the wafer processing method according to the embodiment of the present disclosure may include unloading a first wafer from the first wafer carrier C1 using a first EFEM arm 160 configured to be moved within the first EFEM chamber 110 in the vertical direction (S3300).

In an embodiment, in operation S3300, the first EFEM arm 160 may be moved in the vertical direction until the first EFEM arm 160 is located at the same level as the first wafer carrier C1. In addition, the first EFEM arm 160 may be moved in the horizontal direction to unload the first wafer from the first wafer carrier C1.

Figure 9D:
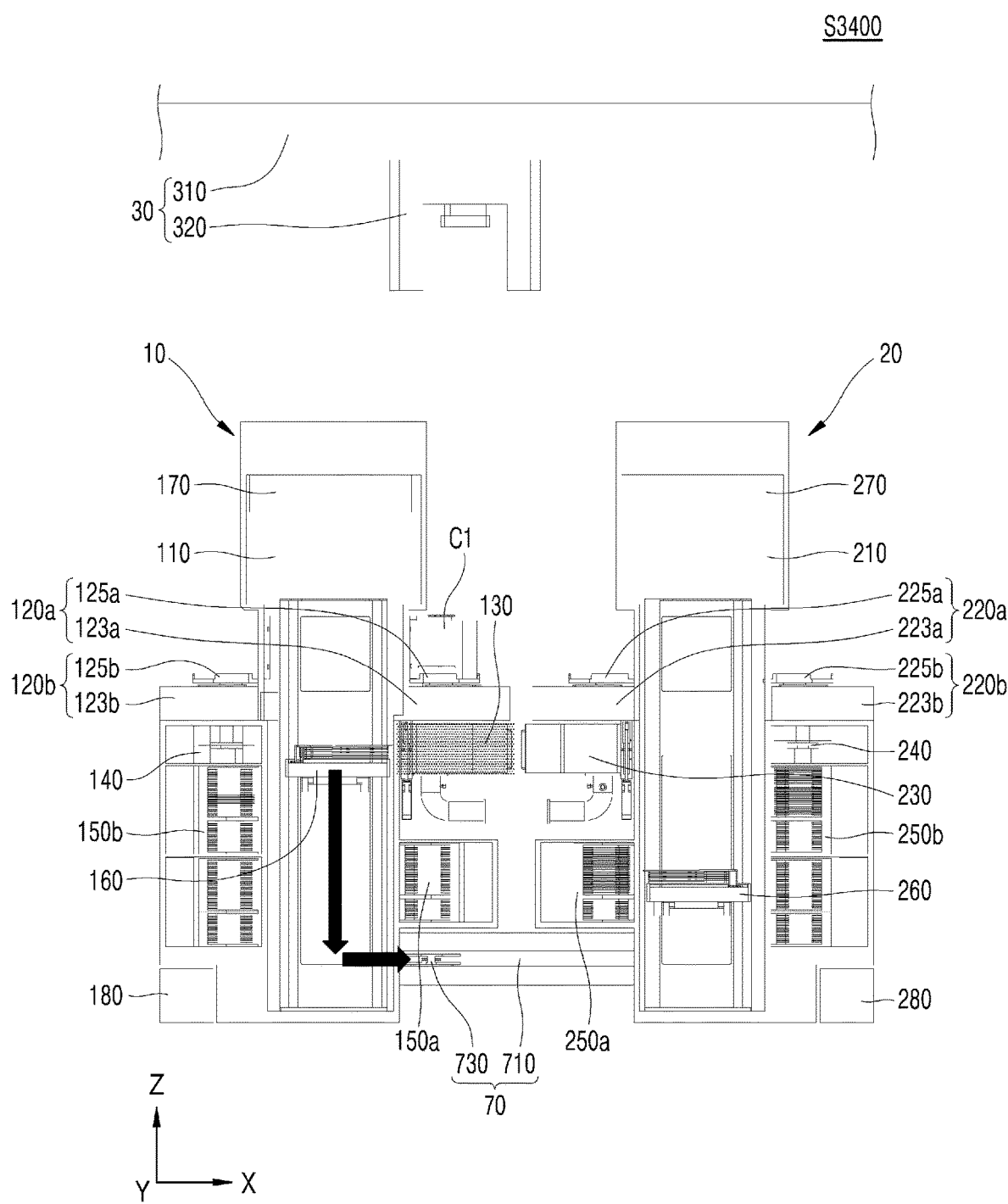
FIG. 9D is a diagram illustrating an operation of the wafer processing method according to the embodiment of the present disclosure.

Referring to FIG. 9D, the wafer processing method according to the embodiment of the present disclosure may include loading the first wafer into the EFEM connection device 70 by using the first EFEM arm 160 (S3400).

In an embodiment, in operation S3400, the first EFEM arm 160 may be moved in the vertical direction until the first EFEM arm 160 is located at the same level as the EFEM connection device 70. In addition, the first EFEM arm 160 may be moved in the horizontal direction to load the first wafer into the EFEM connection device 70. For example, the first EFEM arm 160 may seat the first wafer on the wafer transfer stage 730.

Figure 9E:
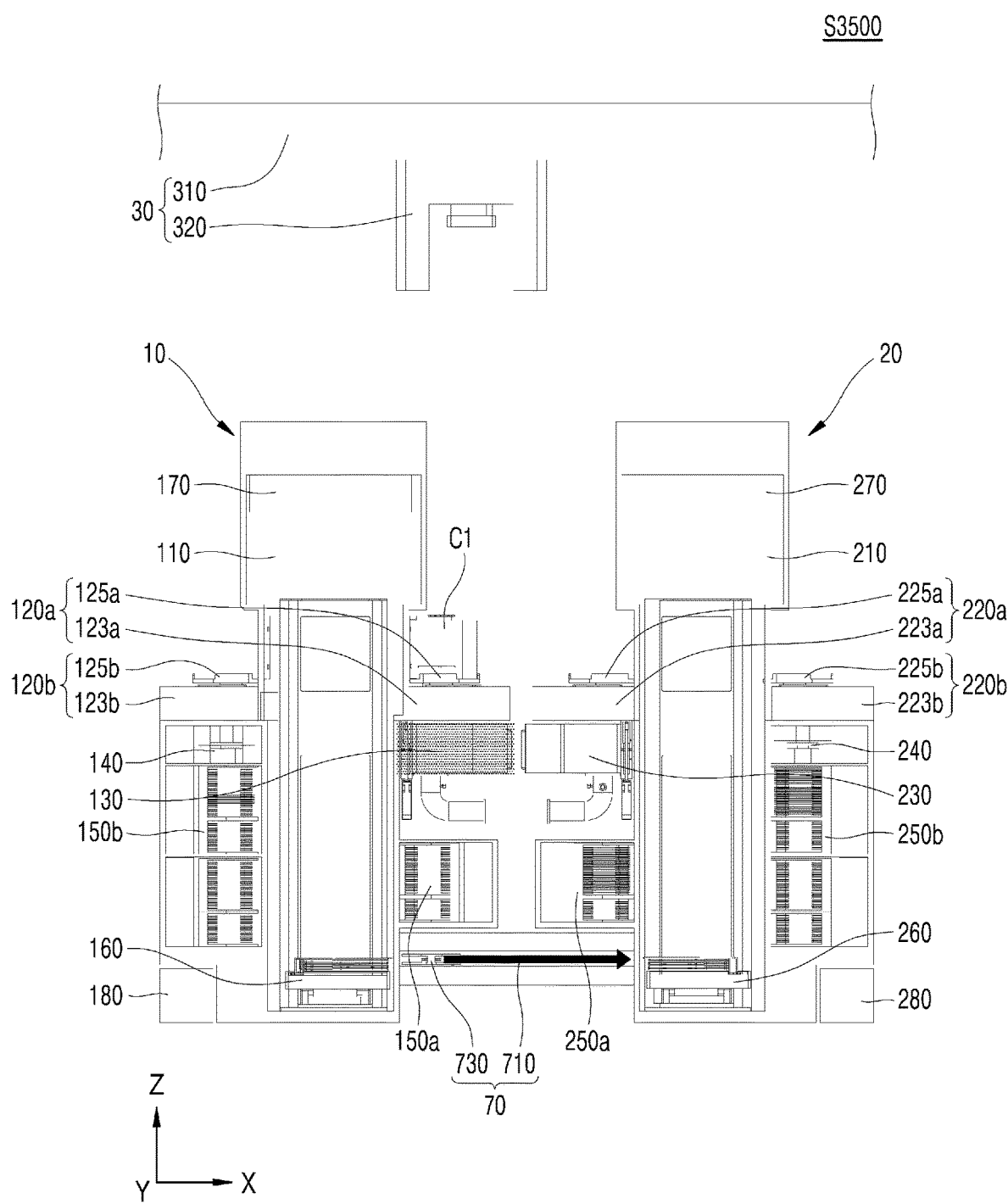
FIG. 9E is a diagram illustrating an operation of the wafer processing method according to the embodiment of the present disclosure.

Referring to FIG. 9E, the wafer processing method according to the embodiment of the present disclosure may include transferring the first wafer from the first EFEM chamber 110 to the second EFEM chamber 210 through the EFEM connection device 70 (S3500). For example, in operation S3500, the wafer transfer stage 730 may be moved within a wafer transfer tunnel 710 in the horizontal direction.

Figure 9F:
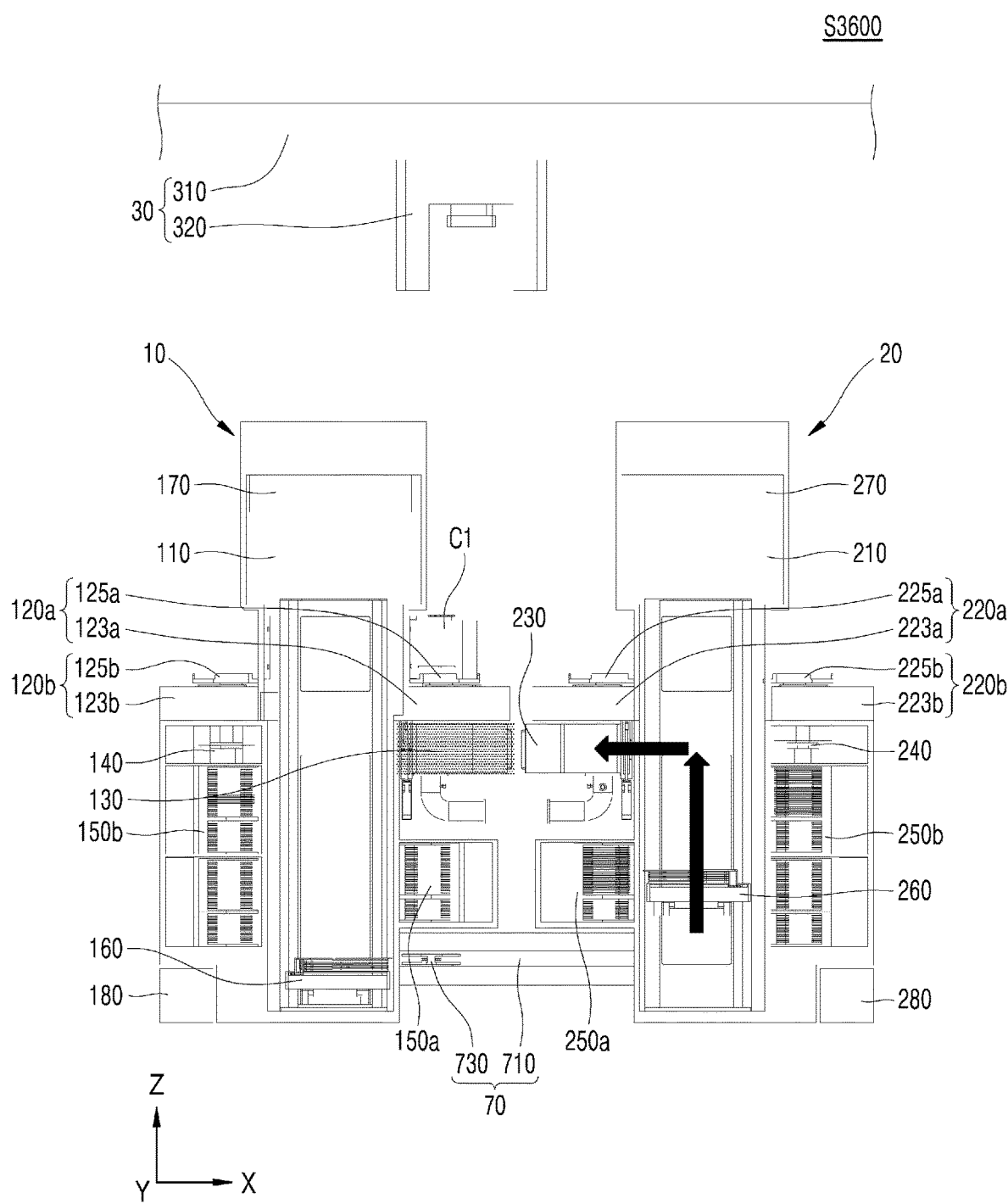
FIG. 9F is a diagram illustrating an operation of the wafer processing method according to the embodiment of the present disclosure.

Referring to FIG. 9F, the wafer processing method according to the embodiment of an embodiment of the present disclosure may include unloading, by the second EFEM arm 260, the first wafer from the EFEM connection device 70 and loading the first wafer into the second load lock 230 (S3600).

In an embodiment, in operation S3600, the second EFEM arm 260 may be moved in the vertical direction until the second EFEM arm 260 is located at the same level as the EFEM connection device 70. In addition, the second EFEM arm 260 may be moved in the horizontal direction to unload the first wafer from the EFEM connection device 70.

The second EFEM arm 260 may be moved in the vertical direction until the second EFEM arm 260 is located at the same level as the second load lock 230. In addition, the second EFEM arm 260 may be moved in the horizontal direction to load the first wafer into the second load lock 230.

The wafer processing method according to the embodiment of the present disclosure may include transferring the first wafer between the first EFEM chamber 110 and the second EFEM chamber 210 through the EFEM connection device 70 (S3500), and thus, the second load lock 230 of the second EFEM 20 is available even when a defects occurs in the first load lock 130 of the first EFEM 10 or when an inner space of the first load lock 130 is filled with wafers. Accordingly, wafer processing efficiency may be improved by the wafer processing method of an embodiment of the present disclosure.

FIGS. 10A to 10D are diagrams illustrating operations of a wafer processing method according to an embodiment of the present disclosure. Specifically, the wafer processing method according to the embodiment of the present disclosure may be a method of loading a first wafer in the first wafer carrier C1 after the first wafer loaded in the second load lock 230 as described above with reference to FIG. 9F is processed.

Figure 10A:
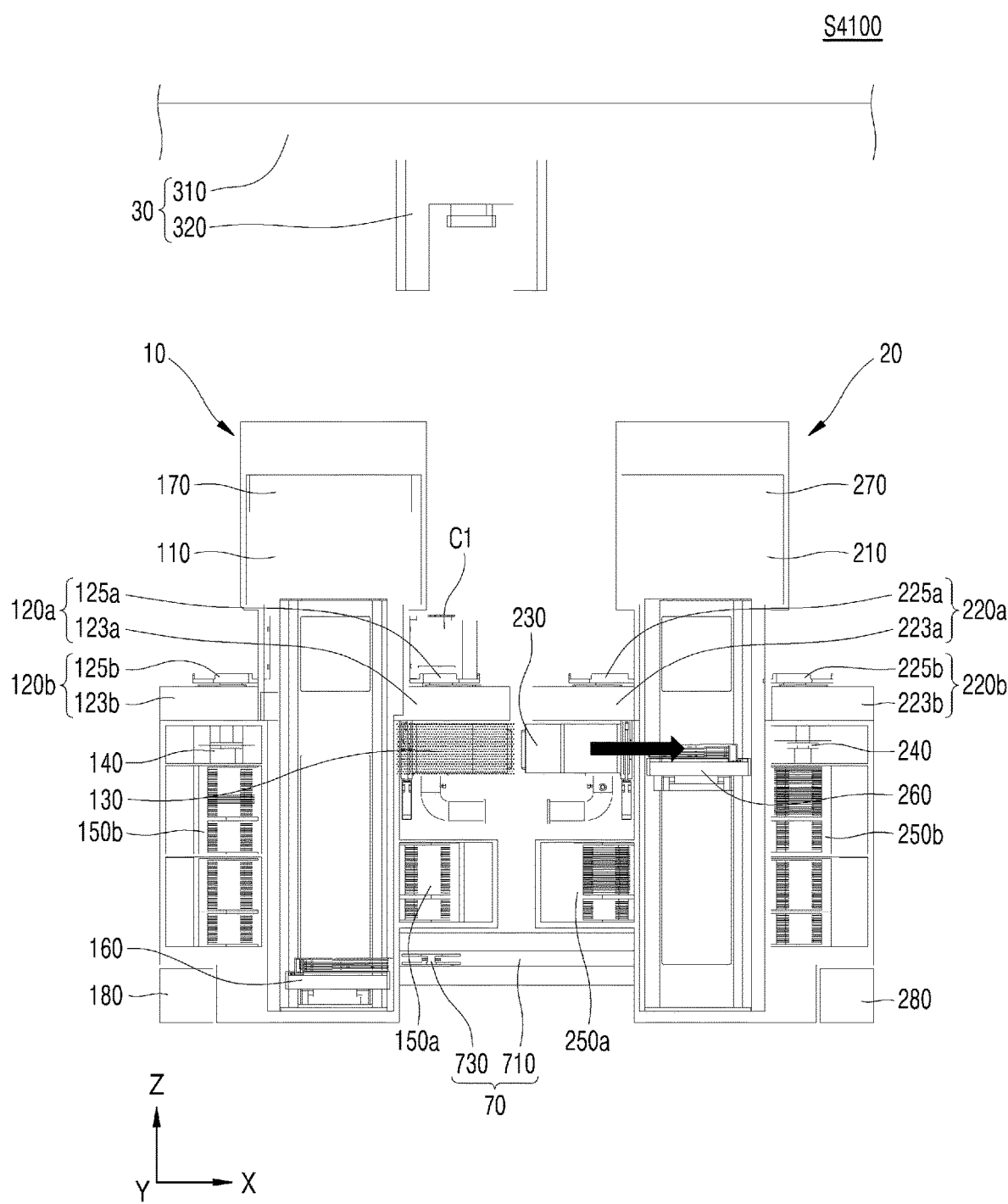
FIG. 10A is a diagram illustrating an operation of a wafer processing method according to an embodiment of the present disclosure.

Referring to FIG. 10A, the wafer processing method according to the embodiment of the present disclosure may include unloading the first wafer from the second load lock 230 (S4100).

In an embodiment, operation S4100 may include adjusting pressure of an inner space of the second load lock 230 to an atmospheric pressure, opening a door of the second load lock 230, and unloading the first wafer from the second load lock 230 using the second EFEM arm 260.

Figure 10B:
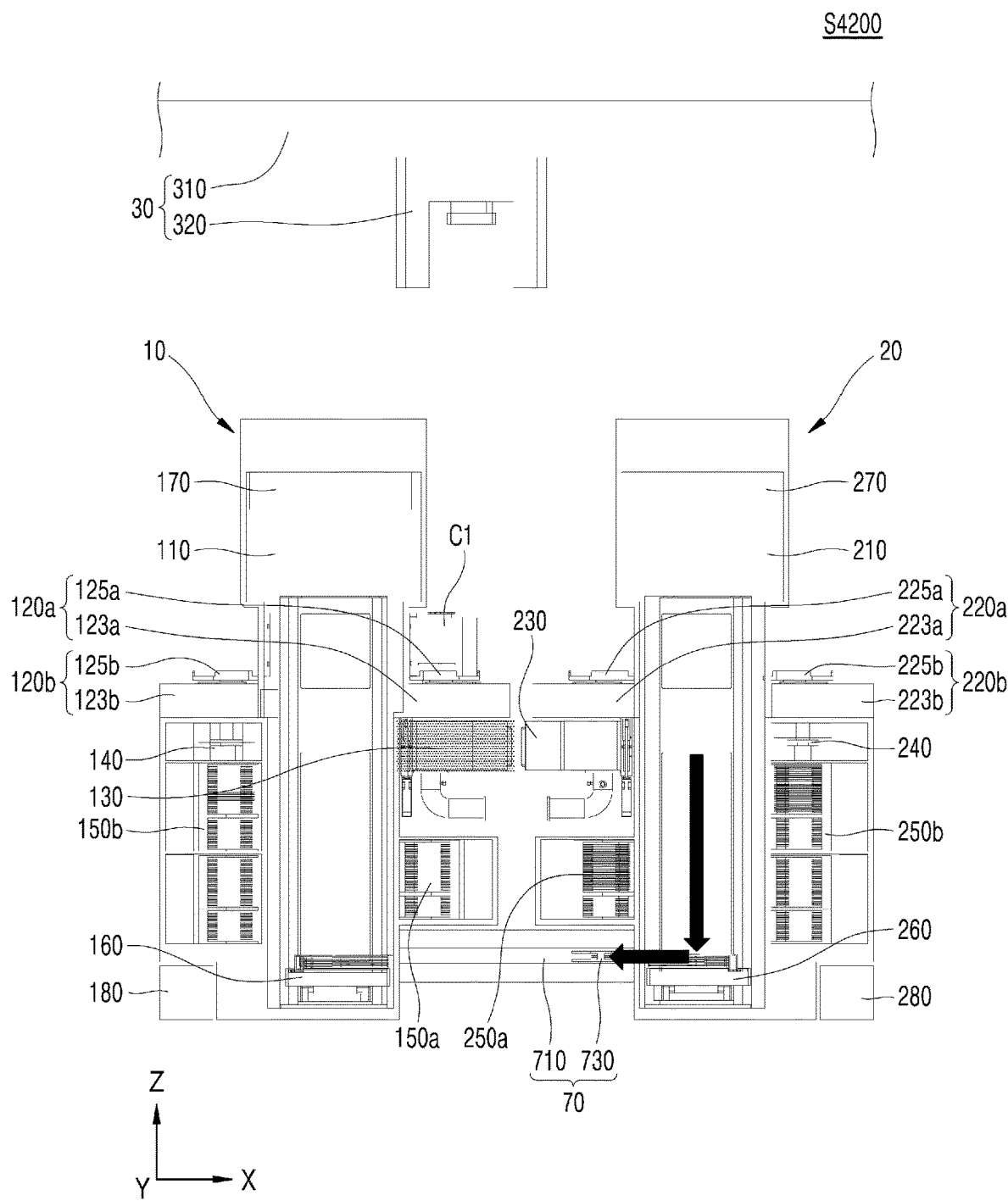
FIG. 10B is a diagram illustrating an operation of the wafer processing method according to the embodiment of the present disclosure.

Referring to FIG. 10B, the wafer processing method according to the embodiment of the present disclosure may include loading the first wafer into the EFEM connection device 70 using the second EFEM arm 260 (S4200).

In an embodiment, in operation S4200, the second EFEM arm 260 may be moved in the vertical direction until the second EFEM arm 260 is located at the same level as the EFEM connection device 70. The second EFEM arm 260 may be moved in the horizontal direction to load the first wafer into the EFEM connection device 70. For example, the second EFEM arm 260 may seat the first wafer on the wafer transfer stage 730.

Figure 10C:
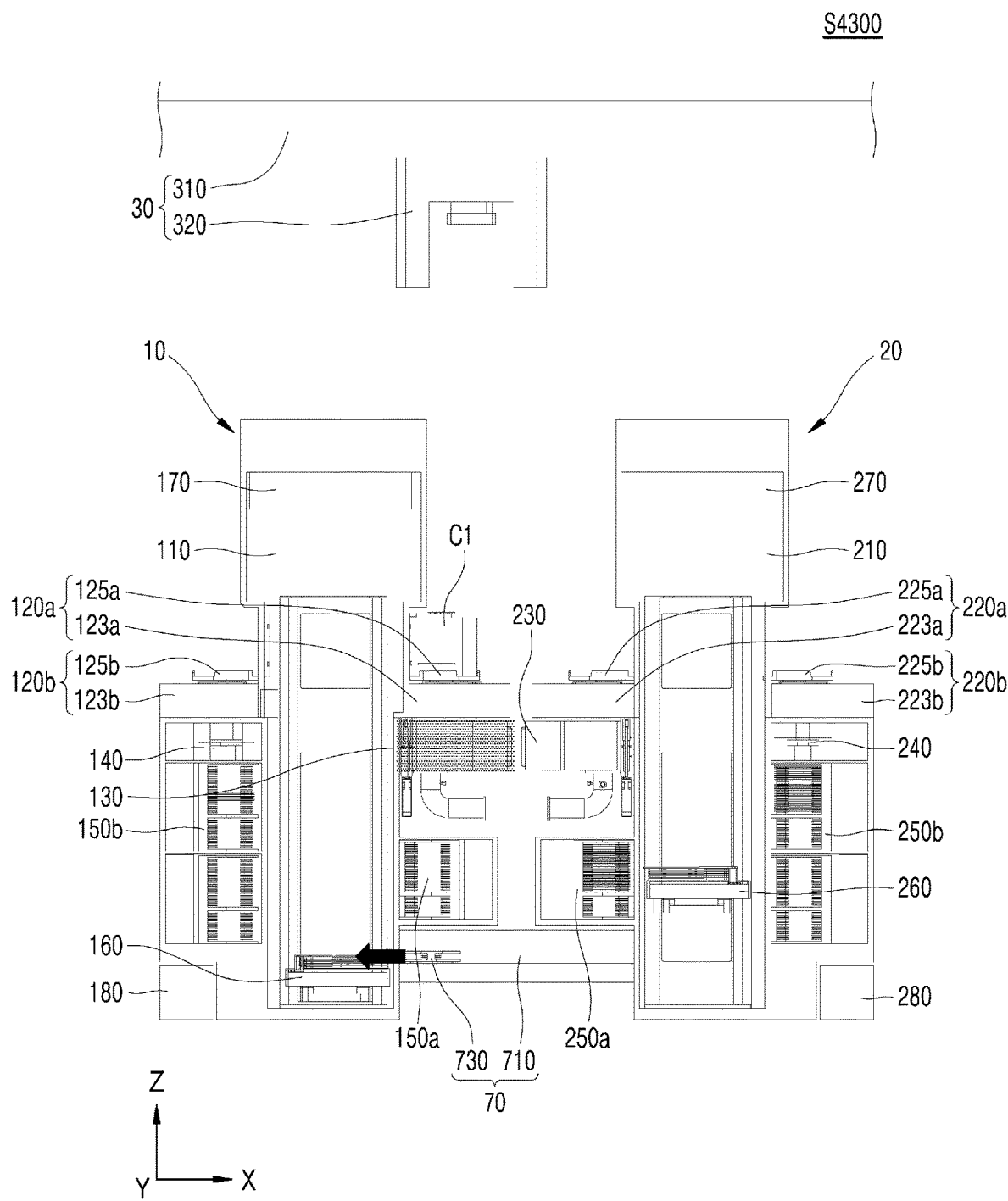
FIG. 10C is a diagram illustrating an operation of the wafer processing method according to the embodiment of the present disclosure.

Referring to FIG. 10C, the wafer processing method according to the embodiment of the present disclosure may include loading the first wafer from the EFEM connection device 70 using the first EFEM arm 160 (S4300).

In an embodiment, in operation S4300, the first EFEM arm 160 may be moved in the vertical direction until the first EFEM arm 160 is located at the same level as the EFEM connection device 70. In addition, the first EFEM arm 160 may be moved in the horizontal direction to unload the first wafer from the EFEM connection device 70.

Figure 10D:
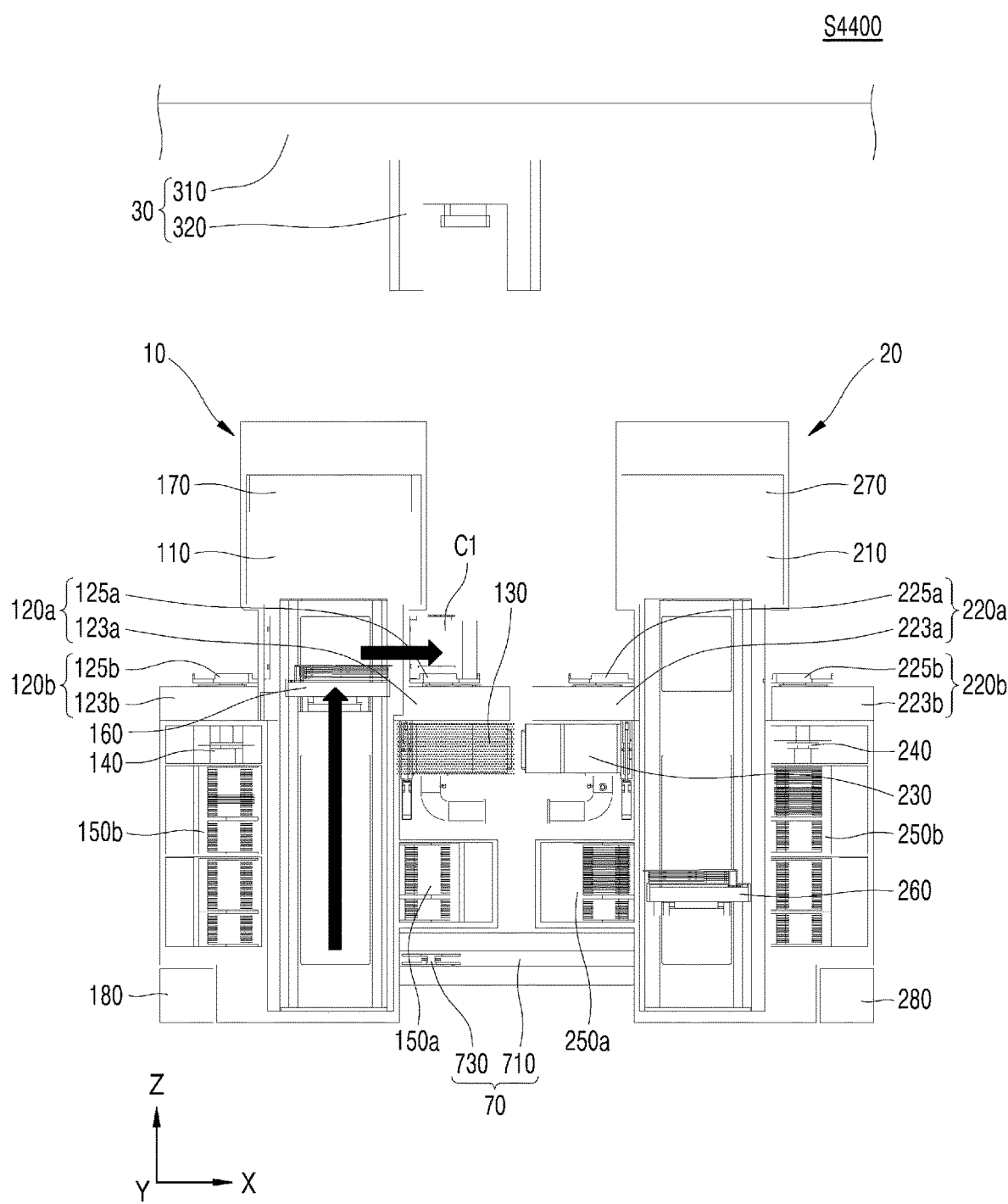
FIG. 10D is a diagram illustrating an operation of the wafer processing method according to the embodiment of the present disclosure.

Referring to FIG. 10D, the wafer processing method according to the embodiment of the present disclosure may include loading the first wafer into the first wafer carrier C1 (S4400).

In an embodiment, when loading of the processed first wafer in the first wafer carrier C1 is completed, a door of the first wafer carrier C1 may be closed. A wafer carrier transfer robot 320 of a wafer carrier transfer device 30 may move in the vertical direction to pick up the first wafer carrier C1, and move in the horizontal direction to transfer the first wafer carrier C1 to an additional process chamber for a subsequent process.

According to one or more embodiments, wafer processing apparatuses (e.g., wafer processing apparatus 1 and wafer processing apparatus 2) may further comprise a controller comprising at least one processor and memory storing computer instructions. The computer instructions, when executed by the at least one processor, may be configured to cause the controller to control any number of components of a wafer processing apparatus to perform their functions. For example, the computer instructions may be configured to cause the controller to cause one or more of the wafer processing methods of embodiments of the present disclosure to be performed by controlling, for example, a wafer carrier transfer device, air supply devices, transfer trays, load ports, wafer aligners, EFEM arms, load locks, wafer buffer devices, vacuum pumps, a wafer transfer chamber, an EFEM connection device, a wafer transfer arm, wafer processing chambers, processing boxes, etc., to perform their respective functions.

While non-limiting example embodiments have been particularly shown and described, it will be understood that various changes in form and details may be made therein without departing from the spirit and scope of the present disclosure.

What is claimed is:

1. A wafer processing apparatus comprising:
    a first equipment front end module (EFEM) comprising:
        a first EFEM chamber;
        a plurality of first load ports provided at at least one from among a first side and a second side of the first EFEM chamber, and configured to support a first wafer carrier accommodating a first wafer;
        a first load lock provided at the first side or the second side of the first EFEM chamber and vertically overlapping with at least one from among the plurality of first load ports; and
        a first EFEM arm configured to be moved within the first EFEM chamber to unload the first wafer from the first wafer carrier and load the first wafer into the first load lock, or to unload the first wafer from the first load lock and load the first wafer into the first wafer carrier;
    a second EFEM provided at the first side of the first EFEM and comprising:
        a second EFEM chamber spaced apart from the first EFEM chamber;
        a plurality of second load ports provided at at least one from among a first side and a second side of the second EFEM chamber and configured to support a second wafer carrier accommodating a second wafer;
        a second load lock provided at the first side or the second side of the second EFEM chamber and vertically overlapping with at least one from among the plurality of second load ports; and
        a second EFEM arm configured to be moved within the second EFEM chamber to unload the second wafer from the second wafer carrier and load the second wafer into the second load lock, or to unload the second wafer from the second load lock and load the second wafer into the second wafer carrier;
    a wafer transfer chamber connected to the first load lock of the first EFEM and the second load lock of the second EFEM;
    a plurality of wafer processing chambers connected to the wafer transfer chamber; and
    a wafer transfer arm provided in the wafer transfer chamber and configured to supply at least one of the first wafer and the second wafer to at least one from among the plurality of wafer processing chambers.

2. The wafer processing apparatus of claim 1, wherein the first EFEM further comprises a first wafer aligner provided at the first side or the second side of the first EFEM chamber and vertically overlapping with at least one of the plurality of first load ports, and
    the second EFEM further comprises a second wafer aligner provided at the first side or the second side of the second EFEM chamber and vertically overlapping with at least one of the plurality of second load ports.

3. The wafer processing apparatus of claim 1, wherein the first EFEM further comprises a first wafer buffer device provided at the first side or the second side of the first EFEM chamber and vertically overlapping with at least one of the plurality of first load ports, and configured to store the first wafer, and
    the second EFEM further comprises a second wafer buffer device provided at the first side or the second side of the second EFEM chamber and vertically overlapping with at least one of the plurality of second load ports, and configured to store the second wafer.

4. The wafer processing apparatus of claim 1, further comprising:
    a wafer transfer tunnel extending between the first EFEM and the second EFEM; and
    a wafer transfer stage provided in the wafer transfer tunnel, and configured to transfer at least one from among the first wafer and the second wafer between the first EFEM chamber and the second EFEM chamber.

5. The wafer processing apparatus of claim 1, wherein each of the plurality of first load ports comprises:
    a first transfer rail provided at the first side or the second side of the first EFEM chamber; and
    a first transfer tray configured to support the first wafer carrier, move in a horizontal direction along the first transfer rail, and rotate about a first axis of rotation parallel to a vertical direction, and
    each of the plurality of second load ports comprises:
        a second transfer rail provided at the first side or the second side of the second EFEM chamber; and
        a second transfer tray configured to support the second wafer carrier, move in the horizontal direction along the second transfer rail, and rotate about a second axis of rotation parallel to the vertical direction.

6. The wafer processing apparatus of claim 1, wherein the first EFEM further comprises a first air supplier provided in the first EFEM chamber and configured to supply air into the first EFEM chamber, and
    the second EFEM further comprises a second air supplier provided in the second EFEM chamber and configured to supply air into the second EFEM chamber.

7. The wafer processing apparatus of claim 1, wherein the plurality of first load ports comprise:
    a first inner load port provided at an inner side of the first EFEM chamber and vertically overlapping with the first load lock; and
    a first outer load port provided at an outer side of the first EFEM chamber, the plurality of second load ports comprise:
        a second inner load port provided at an inner side of the second EFEM chamber and vertically overlapping the second load lock; and
        a second outer load port provided at an outer side of the second EFEM chamber,
    the first EFEM further comprises:
        a first wafer aligner provided at the inner side of the first EFEM chamber and vertically overlapping with the first inner load port; and
        a first wafer buffer device provided at the inner side of the first EFEM chamber and vertically overlapping with the first inner load port, and configured to store the first wafer, and
    the second EFEM further comprises:

a second wafer aligner provided at the inner side of the second EFEM chamber and vertically overlapping with the second inner load port; and a second wafer buffer device provided at the inner side of the second EFEM chamber and vertically overlapping with the second inner load port, and configured to store the second wafer.

8. The wafer processing apparatus of claim 1, wherein the first EFEM further comprises a first vacuum pump configured to control pressure of an inner space of the first load lock, and the second EFEM further comprises a second vacuum pump configured to control pressure of an inner space of the second load lock.

9. The wafer processing apparatus of claim 1, further comprising:
a wafer carrier transfer line above the first EFEM and the second EFEM; and
a wafer carrier transfer robot configured to move along the wafer carrier transfer line, and transfer at least one from among the first wafer carrier and the second wafer carrier to on at least one from among the plurality of first load ports and the plurality of second load ports.

10. A wafer processing apparatus comprising:
a first equipment front end module (EFEM) comprising:
a first EFEM chamber;
a first upper load port provided at a first side or a second side of the first EFEM chamber;
a first lower load port provided at the first side or the second side of the first EFEM chamber and vertically overlapping with the first upper load port;
a first load lock provided at the first side or the second side of the first EFEM chamber and vertically overlapping with the first upper load port and the first lower load port; and
a first EFEM arm configured to transfer a first wafer between a first wafer carrier, while the first wafer carrier is seated on at least one from among the first upper load port and the first lower load port, and the first load lock;
a second EFEM provided at the first side of the first EFEM, and comprising:
a second EFEM chamber spaced apart from the first EFEM chamber;
a second upper load port provided at a first side or a second side of the second EFEM chamber;
a second lower load port provided at the first side or the second side of the second EFEM chamber and vertically overlapping with the second upper load port;
a second load lock provided at the first side or the second side of the second EFEM chamber and vertically overlapping with the second upper load port and the second lower load port; and
a second EFEM arm configured to transfer a second wafer between a second wafer carrier, while the second wafer carrier is seated on at least one from among the second upper load port and the second lower load port, and the second load lock;
a wafer transfer chamber connected to the first load lock of the first EFEM and the second load lock of the second EFEM;
a plurality of wafer processing chambers connected to the wafer transfer chamber; and
a wafer transfer arm provided in the wafer transfer chamber and configured to supply at least one from among the first wafer and the second wafer to at least one of the plurality of wafer processing chambers.

11. The wafer processing apparatus of claim 10, wherein, when the wafer processing apparatus is viewed from a plan view, a planar area of the first lower load port is larger than a planar area of the first upper load port, and a planar area of the second lower load port is larger than a planar area of the second upper load port.

12. The wafer processing apparatus of claim 11, wherein the first upper load port and the second upper load port face each other,
the first lower load port and the second lower load port face each other, and
the wafer transfer chamber vertically overlaps with at least a part of the first lower load port and at least a part of the second lower load port.

13. The wafer processing apparatus of claim 10, wherein the first EFEM further comprises a first wafer aligner provided at the first side or the second side of the first EFEM chamber and vertically overlapping with the first upper load port and the first lower load port, and
the second EFEM further comprises a second wafer aligner provided at the first side or the second side of the second EFEM chamber and vertically overlapping with the second upper load port and the second lower load port.

14. The wafer processing apparatus of claim 13, wherein the first EFEM further comprises a first wafer buffer device provided at the first side or the second side of the first EFEM chamber and vertically overlapping with the first upper load port and the first lower load port, and configured to store the first wafer, and
the second EFEM further comprises a second wafer buffer device provided at the first side or the second side of the second EFEM chamber and vertically overlapping with the second upper load port and the second lower load port, and configured to store the second wafer.

15. The wafer processing apparatus of claim 14, wherein the first upper load port, the first lower load port, the first wafer aligner, and the first wafer buffer device overlap one another in a vertical direction, and
the second upper load port, the second lower load port, the second wafer aligner, and the second wafer buffer device overlap one another in the vertical direction.

16. The wafer processing apparatus of claim 10, further comprising:
a wafer transfer tunnel extending between the first EFEM chamber and the second EFEM chamber; and
a wafer transfer stage provided in the wafer transfer tunnel, and configured to transfer at least one from among the first wafer and the second wafer between the first EFEM chamber and the second EFEM chamber.

17. The wafer processing apparatus of claim 10, wherein each of the first upper load port and the first lower load port comprises:
a first transfer rail provided at the first side or the second side of the first EFEM chamber; and
a first transfer tray configured to support the first wafer carrier, move in a horizontal direction along the first transfer rail, and rotate about a first axis of rotation parallel to a vertical direction, and
each of the second upper load port and the second lower load port comprises:
a second transfer rail provided at the first side or the second side of the second EFEM chamber; and
a second transfer tray configured to support the second wafer carrier, move in the horizontal direction along the second transfer rail, and rotate about a second axis of rotation parallel to the vertical direction.

18. A wafer processing method comprising:
mounting a wafer carrier accommodating a wafer on a load port, the load port provided at a first side or a second side of an equipment front end module (EFEM) chamber;
connecting the wafer carrier to the EFEM chamber by operating the load port;
unloading, by an EFEM arm configured to be moved within the EFEM chamber in a vertical direction, the wafer from the wafer carrier;
loading, by the EFEM arm, the wafer into a wafer aligner to align the wafer; and
unloading, by the EFEM arm, the wafer from the wafer aligner and loading, by the EFEM arm, the wafer into a load lock, the load lock provided at the first side of the EFEM chamber and overlapped with the load port in the vertical direction.

19. The wafer processing method of claim 18, further comprising:
controlling an inner space of the load lock to have a vacuum pressure while the wafer is within the load lock;
loading the wafer from the load lock into a wafer processing chamber;
processing the wafer in the wafer processing chamber; and
unloading the wafer from the wafer processing chamber and loading the wafer into the load lock.

20. The wafer processing method of claim 19, further comprising:
unloading the wafer from the load lock after the unloading the wafer from the wafer processing chamber and the loading the wafer into the load lock;
temporality storing the wafer by loading, by the EFEM arm, the wafer into a wafer buffer device after unloading the wafer from the load lock; and
unloading the wafer from the wafer buffer device and loading the wafer into the wafer carrier on the load port.

* * * * *